United States Patent
Scott et al.

(10) Patent No.: US 9,444,411 B2
(45) Date of Patent: Sep. 13, 2016

(54) RF POWER AMPLIFIER WITH TOTAL RADIATED POWER STABILIZATION

(71) Applicant: RF Micro Devices (Cayman Islands), Ltd., George Town, Grand Cayman (KY)

(72) Inventors: Baker Scott, San Jose, CA (US); Dirk Robert Walter Leipold, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/218,953

(22) Filed: Mar. 18, 2014

(65) Prior Publication Data

US 2014/0266452 A1  Sep. 18, 2014

Related U.S. Application Data

(60) Provisional application No. 61/793,583, filed on Mar. 15, 2013, provisional application No. 61/789,508, filed on Mar. 15, 2013, provisional application No. 61/800,772, filed on Mar. 15, 2013, provisional (Continued)

(51) Int. Cl.
*H01Q 11/12* (2006.01)
*H04B 1/04* (2006.01)
(Continued)

(52) U.S. Cl.
CPC ............ *H03F 1/3241* (2013.01); *H01F 27/28* (2013.01); *H01F 27/385* (2013.01); *H03F 1/32* (2013.01);
(Continued)

(58) Field of Classification Search
CPC ...... H03F 1/0205; H03F 1/32; H03F 1/3211; H03F 1/3241; H03F 1/3247; H03F 1/3288; H03F 1/34; H03F 1/345; H03F 3/19; H03F 3/195; H03F 3/211; H03F 3/213; H03F 3/24; H03F 3/45475; H03F 2200/105; H03F 2200/465; H04B 17/13; H03G 3/20

USPC ............ 455/114.2, 114.3, 115.1, 115.3, 126, 455/127.2, 127.3; 375/296, 297; 330/149, 330/254, 278, 291
See application file for complete search history.

(56) References Cited

U.S. PATENT DOCUMENTS

| | | | |
|---|---|---|---|
| 5,420,536 A | 5/1995 | Faulkner et al. | |
| 5,507,014 A * | 4/1996 | Wray et al. | 455/114.3 |

(Continued)

FOREIGN PATENT DOCUMENTS

| | | |
|---|---|---|
| EP | 1184977 A2 | 3/2002 |
| WO | 2005117255 A1 | 12/2005 |

OTHER PUBLICATIONS

Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.

(Continued)

*Primary Examiner* — Quochien B Vuong
(74) *Attorney, Agent, or Firm* — Withrow & Terranova, P.L.L.C.

(57) ABSTRACT

A radio frequency (RF) amplification circuit and a closed-loop amplitude linearization circuit are disclosed. The RF amplification circuit amplifies an RF signal to generate an amplified RF signal. The RF amplification circuit and the closed-loop amplitude linearization circuit form a fast control loop and a slow control loop. The slow control loop estimates a total radiated power (TRP) from the RF amplification circuit to create a TRP estimate using a representation of the amplified RF signal, and controls a fast loop gain of the fast control loop based on the TRP estimate. The fast control loop applies a gain adjustment to the RF amplification circuit based on the fast loop gain and a difference between a target reference amplitude and a measured feedback amplitude. The gain adjustment controls amplitude distortion in the RF amplification circuit. The fast loop gain controls TRP-drift in the RF amplification circuit.

30 Claims, 24 Drawing Sheets

Related U.S. Application Data application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | | |
|---|---|---|
| H03F 3/45 | (2006.01) | |
| H03F 1/32 | (2006.01) | |
| H03F 3/195 | (2006.01) | |
| H03F 3/21 | (2006.01) | |
| H03F 3/19 | (2006.01) | |
| H03F 3/213 | (2006.01) | |
| H01F 27/28 | (2006.01) | |
| H01F 27/38 | (2006.01) | |
| H03H 7/09 | (2006.01) | |
| H03H 7/01 | (2006.01) | |

(52) U.S. Cl.
CPC ............... *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01)

(56) References Cited

U.S. PATENT DOCUMENTS

| | | | |
|---|---|---|---|
| 5,675,288 A | 10/1997 | Peyrotte et al. | |
| 6,137,354 A | 10/2000 | Dacus et al. | |
| 6,330,289 B1 | 12/2001 | Keashly et al. | |
| 6,707,338 B2 | 3/2004 | Kenington et al. | |
| 6,819,938 B2* | 11/2004 | Sahota ................. | 455/522 |
| 6,836,517 B2 | 12/2004 | Nagatani et al. | |
| 6,980,774 B2* | 12/2005 | Shi ................ | H04B 1/406 375/133 |
| 7,102,430 B2 | 9/2006 | Johnson et al. | |
| 7,164,313 B2* | 1/2007 | Capofreddi et al. .......... | 330/136 |
| 7,212,798 B1 | 5/2007 | Adams et al. | |
| 7,250,815 B2 | 7/2007 | Taylor et al. | |
| 7,317,353 B2 | 1/2008 | Hayase | |
| 7,321,264 B2 | 1/2008 | Kokkeler | |
| 7,333,557 B2* | 2/2008 | Rashev et al. ................ | 375/296 |
| 7,340,229 B2 | 3/2008 | Nakayama et al. | |
| 7,471,739 B1 | 12/2008 | Wright | |
| 7,652,532 B2 | 1/2010 | Li et al. | |
| 7,917,106 B2* | 3/2011 | Drogi et al. ............... | 455/127.1 |
| 7,970,360 B2* | 6/2011 | Pei ............................ | 455/114.3 |
| 8,013,674 B2 | 9/2011 | Drogi et al. | |
| 8,126,409 B2 | 2/2012 | Osman et al. | |
| 8,175,551 B2 | 5/2012 | Akaiwa | |
| 8,344,806 B1 | 1/2013 | Franck et al. | |
| 8,410,846 B2 | 4/2013 | Zare-Hoseini | |
| 8,620,233 B2* | 12/2013 | Brobston ................... | 455/114.3 |
| 8,624,678 B2 | 1/2014 | Scott et al. | |
| 8,653,888 B2 | 2/2014 | Watanabe | |
| 8,653,890 B1 | 2/2014 | Ahmed et al. | |
| 8,736,511 B2 | 5/2014 | Morris, III | |
| 8,749,310 B2 | 6/2014 | Hayes | |
| 8,791,769 B2 | 7/2014 | Leong et al. | |
| 8,829,995 B2 | 9/2014 | Cohen | |
| 8,841,983 B2 | 9/2014 | Newton et al. | |
| 9,094,104 B2 | 7/2015 | Din et al. | |
| 9,124,355 B2 | 9/2015 | Black et al. | |
| 9,203,455 B2 | 12/2015 | Yang et al. | |
| 2002/0057139 A1 | 5/2002 | Matsumura et al. | |
| 2002/0186378 A1 | 12/2002 | Tazartes et al. | |
| 2002/0190795 A1 | 12/2002 | Hoang | |
| 2003/0008577 A1 | 1/2003 | Quigley et al. | |
| 2003/0151409 A1 | 8/2003 | Marek | |
| 2004/0121741 A1 | 6/2004 | Rashev et al. | |
| 2004/0162042 A1 | 8/2004 | Chen et al. | |
| 2004/0196085 A1 | 10/2004 | Shen | |
| 2004/0222868 A1 | 11/2004 | Rathgeber et al. | |
| 2005/0123064 A1* | 6/2005 | Ben-Ayun et al. .......... | 375/295 |
| 2005/0195063 A1 | 9/2005 | Mattsson | |
| 2005/0237144 A1 | 10/2005 | Einzinger et al. | |
| 2006/0033602 A1 | 2/2006 | Mattsson | |
| 2006/0125465 A1 | 6/2006 | Xiang et al. | |
| 2006/0226943 A1 | 10/2006 | Marques | |
| 2006/0261890 A1 | 11/2006 | Floyd et al. | |
| 2006/0281431 A1 | 12/2006 | Isaac et al. | |
| 2007/0161361 A1 | 7/2007 | Vaisanen et al. | |
| 2008/0122560 A1 | 5/2008 | Liu | |
| 2009/0309661 A1 | 12/2009 | Chang et al. | |
| 2010/0013562 A1 | 1/2010 | Stockinger et al. | |
| 2011/0103494 A1 | 5/2011 | Ahmadi | |
| 2011/0163824 A1 | 7/2011 | Kawano | |
| 2011/0241163 A1 | 10/2011 | Liu et al. | |
| 2012/0081192 A1 | 4/2012 | Hanaoka | |
| 2012/0249266 A1 | 10/2012 | Lim et al. | |
| 2012/0262252 A1 | 10/2012 | Tseng et al. | |
| 2013/0049902 A1 | 2/2013 | Hendry et al. | |
| 2013/0244591 A1 | 9/2013 | Weissman et al. | |
| 2013/0295863 A1 | 11/2013 | Shanan | |
| 2014/0133189 A1 | 5/2014 | Worek | |
| 2014/0266432 A1* | 9/2014 | Scott et al. ................... | 330/149 |
| 2014/0266451 A1* | 9/2014 | Scott et al. ................... | 330/278 |
| 2014/0266457 A1* | 9/2014 | Scott et al. ................... | 330/291 |
| 2014/0266458 A1* | 9/2014 | Scott et al. ................... | 330/291 |
| 2014/0266459 A1* | 9/2014 | Scott et al. ................... | 330/294 |
| 2014/0266531 A1* | 9/2014 | Leipold et al. ............... | 336/170 |
| 2015/0054582 A1 | 2/2015 | Goss | |

OTHER PUBLICATIONS

Brounley, Richard W., "Matching Networks for Power Amplifiers Operating into High VSWR Loads," High Frequency Electronics, May 2004, pp. 58-62.

Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.

Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.

D'Andrea, Aldo N., et al., "RF Power Amplifier Linearization through Amplitude and Phase Predistortion," IEEE Transactions on Communications, vol. 44, No. 11, Nov. 1996, pp. 1477-1484.

Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.

Dawson, Joel L., "Feedback Linearization of RF Power Amplifiers," Dissertation for Stanford University, Stanford, Calif., Aug. 2003, 191 pages.

Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.

Do, Ji-Hoon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.

Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.

Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.

Hur, J., et al., "An Amplitude and Phase Mismatches Calibration Technique for the LINC Transmitter with Unbalance Phase Control," IEEE Transactions on Vehicular Technology, vol. 60, No. 9, Nov. 2011, pp. 4184-4193.

Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.

(56) References Cited

OTHER PUBLICATIONS

Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.
Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.
Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.
Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.
Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.
Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.
Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.
Rachakonda, Anil, et al., "Log Amps and Directional Couplers Enable VSWR Detection," RF Design Magazine, Jan. 2007, pp. 28-34.
Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.
So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.
Woo, Wangmyong, et al., "A New Envelope Predistortion Linearization Architecture for Handset Power Amplifiers," IEEE Radio and Wireless Conference, Sep. 19-22, 2014, pp. 175-178.
Zhang, X., et al., "Gain/Phase Imbalance-Minimization Techniques for LINC Transmitters," IEEE Transactions on Microwave Theory and Techniques, vol. 49, No. 12, Dec. 2011, pp. 2507-2516.
International Search Report and Written Opinion for PCT/US2014/030431, mailed Jun. 20, 2014, 14 pages.
Notice of Allowance for U.S. Appl. No. 14/215,815, mailed Oct. 1, 2015, 7 pages.
Non-Final Office Action for U.S. Appl. No. 14/215,800, mailed Nov. 20, 2015, 5 pages.
Final Office Action for U.S. Appl. No. 14/217,199, mailed Oct. 19, 2015, 5 pages.
Non-Final Office Action for U.S. Appl. No. 14/216,560, mailed Jul. 16, 2015, 9 pages.
International Preliminary Report on Patentability for PCT/US/2014/030431, mailed Sep. 24, 2015, 10 pages.
Non-Final Office Action for U.S. Appl. No. 14/216,794, mailed Jun. 30, 2015, 5 pages.
Non-Final Office Action for U.S. Appl. No. 14/215,815, mailed May 4, 2015, 13 pages.
Non-Final Office Action for U.S. Appl. No. 14/216,376, mailed May 7, 2015, 8 pages.
Non-Final Office Action for U.S. Appl. No. 14/217,199, mailed Jul. 2, 2015, 6 pages.
Notice of Allowance for U.S. Appl. No. 14/216,794, mailed Nov. 24, 2015, 7 pages.
Non-Final Office Action for U.S. Appl. No. 14/555,053, mailed Dec. 31, 2015, 5 pages.
Notice of Allowance for U.S. Appl. No. 14/216,376, mailed Feb. 22, 2016, 10 pages.
Final Office Action for U.S. Appl. No. 14/215,800, mailed Mar. 11, 2016, 6 pages.
Non-Final Office Action for U.S. Appl. No. 14/217,199, mailed Feb. 4, 2016, 5 pages.
Non-Final Office Action for U.S. Appl. No. 14/216,560, mailed Feb. 2, 2016, 9 pages.
Notice of Allowance for U.S. Appl. No. 14/555,053, mailed Apr. 19, 2016, 7 pages.
Final Office Action for U.S. Appl. No. 14/217,199, mailed Jul. 7, 2016, 5 pages.
Non-Final Office Action for U.S. Appl. No. 14/555,557, mailed Jun. 13, 2016, 28 pages.

\* cited by examiner

RF POWER AMPLIFIER WITH TOTAL RADIATED POWER STABILIZATION

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

Please note that Mar. 15, 2014, fell on a Saturday and the United States Patent & Trademark Office was closed due to inclement weather on Monday, Mar. 17, 2014. As such, this application was filed on Tuesday, Mar. 18, 2014 and enjoys the benefit of the stated priority claims.

The present application is related to U.S. patent application Ser. No. 14/215,815, filed Mar. 17, 2014, entitled "GAIN AND PHASE CALIBRATION FOR CLOSED LOOP FEEDBACK LINEARIZED AMPLIFIERS," now U.S. Pat. No. 9,294,045; U.S. patent application Ser. No. 14/217,199, filed Mar. 17, 2014, entitled "POWER AMPLIFIER WITH WIDE DYNAMIC RANGE AM FEEDBACK LINEARIZATION SCHEME"; U.S. patent application Ser. No. 14/216,794, filed Mar. 17, 2014, entitled "RF POWER AMPLIFIER WITH PM FEEDBACK LINEARIZATION," now U.S. Pat. No. 9,294,046; U.S. patent application Ser. No. 14/215,800, filed Mar. 17, 2014, entitled "WEAKLY COUPLED BASED HARMONIC REJECTION FILTER FOR FEEDBACK LINEARIZATION POWER AMPLIFIER"; U.S. patent application Ser. No. 14/216,376, filed Mar. 17, 2014, entitled "AMPLIFIER PHASE DISTORTION CORRECTION BASED ON AMPLITUDE DISTORTION MEASUREMENT," now U.S. Pat. No. 9,391,565; and U.S. patent application Ser. No. 14/216,560, entitled "RF REPLICATOR FOR ACCURATE MODULATED AMPLITUDE AND PHASE MEASUREMENT".

All of the applications listed above are hereby incorporated herein by reference in their entireties.

FIELD OF THE DISCLOSURE

Embodiments of the present disclosure relate to radio frequency (RF) communications systems, which may include an RF amplification device, an integrated circuit (IC) package, upstream RF system circuitry, downstream RF system circuitry, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and conforms to increasingly restrictive performance requirements.

SUMMARY

An RF amplification circuit and a closed-loop amplitude linearization circuit are disclosed according to a first embodiment of the present disclosure. The RF amplification circuit amplifies an RF signal to generate an amplified RF signal. The RF amplification circuit and the closed-loop amplitude linearization circuit form a fast control loop and a slow control loop. The slow control loop estimates a total radiated power (TRP) from the RF amplification circuit to create a TRP estimate using a representation of the amplified RF signal, and controls a fast loop gain of the fast control loop based on the TRP estimate. The fast control loop applies a gain adjustment to the RF amplification circuit based on the fast loop gain and a difference between a target reference amplitude and a measured feedback amplitude. The gain adjustment controls amplitude distortion in the RF amplification circuit. The fast loop gain controls TRP-drift in the RF amplification circuit.

An integrated circuit (IC) package, the RF amplification circuit, and the closed-loop gain linearization circuit are disclosed according to a second embodiment of the present disclosure. The IC package has a package interface, which receives the RF signal and provides the amplified RF signal. The RF amplification circuit is in the IC package and amplifies the RF signal to generate the amplified RF signal. The closed-loop gain linearization circuit is in the IC package and endogenously estimates the TRP to create the TRP estimate using the amplified RF signal. The closed-loop gain linearization circuit then endogenously determines a measured feedback power based on the TRP estimate and endogenously applies a gain adjustment to the RF amplification circuit based on a difference between a target reference power of the amplified RF signal and the measured feedback power. The gain adjustment controls the amplitude distortion in the RF amplification circuit, the TRP-drift in the RF amplification circuit, or both.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
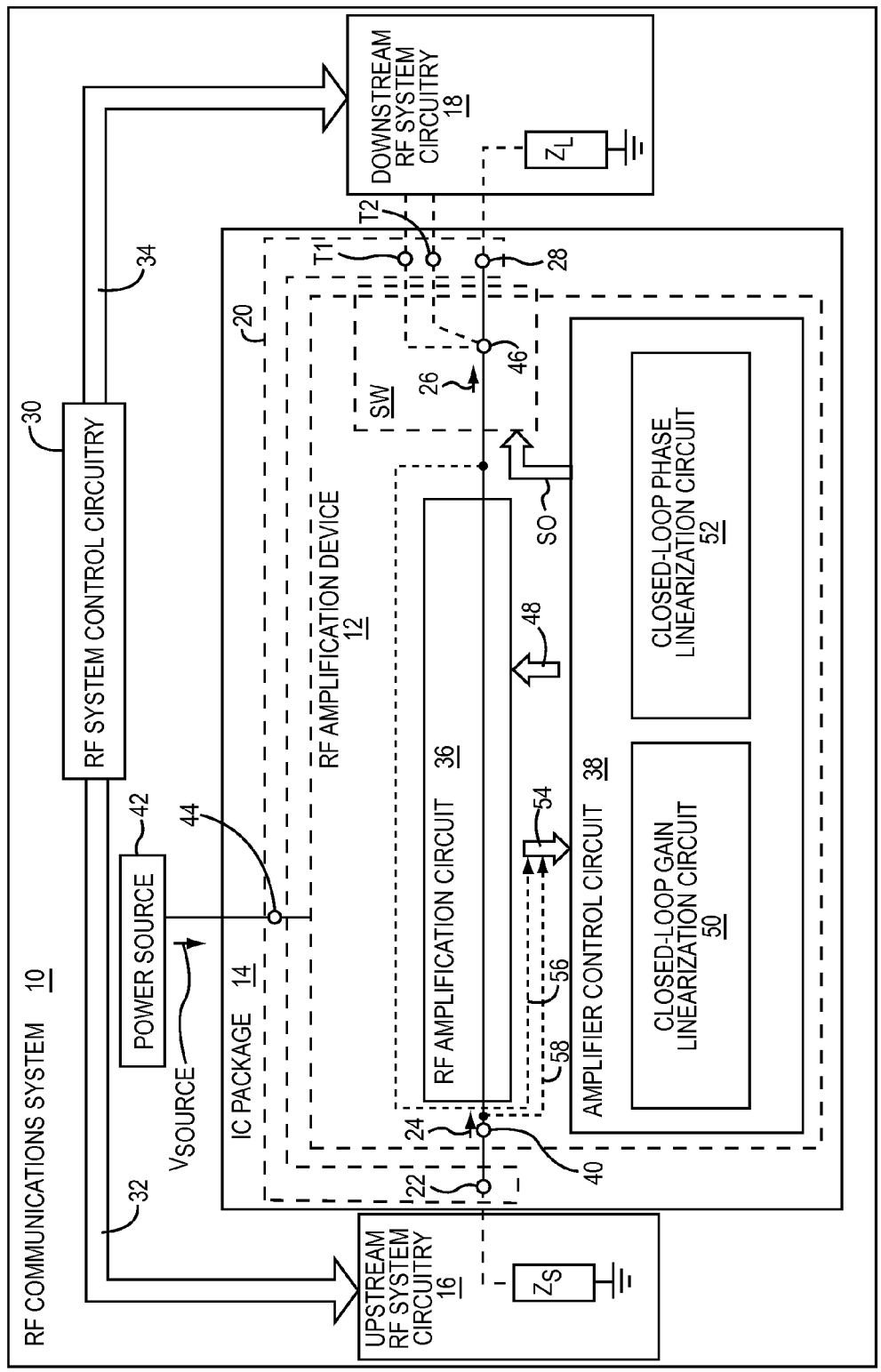
FIG. 1 illustrates a block diagram of an exemplary radio frequency (RF) communications system that includes an exemplary RF amplification device integrated into an exemplary integrated circuit (IC) package.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

An RF amplification circuit and a closed-loop amplitude linearization circuit are disclosed according to a first embodiment of the present disclosure. The RF amplification circuit amplifies an RF signal to generate an amplified RF signal. The RF amplification circuit and the closed-loop amplitude linearization circuit form a fast control loop and a slow control loop. The slow control loop estimates the TRP from the RF amplification circuit to create the TRP estimate using a representation of the amplified RF signal, and controls a fast loop gain of the fast control loop based on the TRP estimate. The fast control loop applies a gain adjustment to the RF amplification circuit based on the fast loop gain and a difference between a target reference amplitude and a measured feedback amplitude. The gain adjustment controls amplitude distortion in the RF amplification circuit. The fast loop gain controls TRP-drift in the RF amplification circuit.

An integrated circuit (IC) package, the RF amplification circuit, and the closed-loop gain linearization circuit are disclosed according to a second embodiment of the present disclosure. The IC package has a package interface, which receives the RF signal and provides the amplified RF signal. The RF amplification circuit is in the IC package and amplifies the RF signal to generate the amplified RF signal. The closed-loop gain linearization circuit is in the IC package and endogenously estimates the TRP to create the TRP estimate using the amplified RF signal. The closed-loop gain linearization circuit then endogenously determines a measured feedback power based on the TRP estimate and endogenously applies a gain adjustment to the RF amplification circuit based on a difference between a target reference power of the amplified RF signal and the measured feedback power. The gain adjustment controls the amplitude distortion in the RF amplification circuit, the TRP-drift in the RF amplification circuit, or both.

Information, which may be pertinent to the present invention, is presented according to one embodiment of the present invention. Modern communication systems use small size antennas that are very sensitive to the surrounding environment. For example, the load impedance of the antenna can be strongly modified by surrounding elements. The varying antenna impedance results in modification of the TRP. TRP is such a modification and is not compensated for in the RF amplification circuit. Many communication systems and standards require that the TRP be kept constant or at least in a bounded interval. For example, in the case of cellular handsets, the TRP may depend on the relative position of the human body (hand, head, body) and other objects such as metallic structures. Such objects may move with respect to the handset antenna or alternatively or concurrently, the handset is moving, such that the antenna load impedance changes. In most applications, the changes in the load impedance (VSWR) happens at very low frequencies (e.g., sub-100 Hz or even sub-single Hz) where there is a desired communication signal spectrum. Therefore the linearization control that happens "fast" at the modulation bandwidth and the TRP control that happens "slow" can be readily separated.

The TRP varies due to the "slow" variation of the load impedance (VSWR). The TRP can be stabilized using a control circuit driven either by a TRP sensor or by a VSWR sensor, or even a combination of the two. The VS WR may be detected by estimating a load complex impedance value. This is a complex number that needs to be presented as a scalar to be used. The TRP may be detected by a bias circuit that estimates the delivered output power at a certain place in the RF amplification circuit. This can be described by a single scalar. The TRP can be derived from the VSWR while the inverse is not generally possible. While possible structures exist to measure the TRP (e.g., direct signal coupler), they are large in size and have large costs that make them unattractive. Embodiments of this disclosure use voltage and current sensors to calculate (estimate) the TRP that may have the advantage of small size, low cost and ease of integration with the RF amplification circuit and its auxiliary linearization (distortion reduction) circuitry.

Embodiments of this invention are based on the key observation that the distortion has a frequency spectrum situated at higher frequencies. Therefore, it needs fast detection and correction. In contrast, the TRP variations due to the load changes (VSWR) have a frequency spectrum situated at very low frequencies where negligible desired signal and distortion exists. Therefore the TRP stabilization needs slow detection and correction. Since the distortion corrected by the linearization loop and circuitry and the TRP stabilized by the TRP loop and circuitry are situated at different frequencies, their sensing and correction/stabilization can be done with different types of detectors and associated circuitry and filtering. As a result, significant size and cost reduction of the overall system may be realized. Embodiments of this invention use current and voltage sensors to estimate the TRP and generate control to stabilize the TRP. While both voltage and current can have fast signal processing that senses both the distortion and the slow TRP variation, such solutions usually result in high size, cost, and power dissipation. Nonetheless, fast signal processing is viable and the slow TRP can be computed starting from the fast (modulation bandwidth) voltage and current. Many of the embodiments described in this disclosure focus on the use of only one fast detector and one slow detector. The fast detector is used by the linearization circuit, while both the slow and the fast detectors are used by the TRP stabilization circuit.

In the general case, voltage and current can be used interchangeably for the TRP stabilization loop. In one embodiment, the fast detector is the output current detector (or a replica output current that emulates the output current) and the slow detector processes the output voltage. In such a case the output voltage path does not need a harmonic rejection filter. Only the fast current path used by the linearization loop needs a harmonic filter such that the linearization loop reacts only to the fundamental component of the signal and its distortion. In another embodiment, the fast detector can be the output voltage detector, while the slow detector can be the output current detector. Only the fast voltage path used by the linearization loop needs a harmonic filter such that the linearization loop reacts only to the fundamental component of the signal and its distortion. In general, a TRP detector (estimator) that uses sensed output current and voltage that includes the impact of the variable load (slow VSWR change) may result in higher complexity, size, and cost of the TRP estimator.

Many of the embodiments presented in this disclosure use a TRP estimator based on one signal that is directly impacted by the load impedance variation (VSWR) and a second signal in which the impact of the VSWR variation is strongly attenuated (rejected). In one embodiment, the output voltage is a signal that has the entire VSWR impact present, while the output current (or replica output current) has only the fast distortion information present, such that the VSWR impact is strongly attenuated (for example by the replica output current sensor). Such embodiments may result in ease of implementation. In a second embodiment, the output current is the signal that has the entire VSWR impact present, while the output voltage path (or replica output voltage) has only fast distortion information present, such that the VSWR impact is strongly attenuated. This requires some form of VSWR rejection circuit for the voltage sensing path. Only the fast sensing path that has the distortion information needs a harmonic rejection filter to make the linearization loop react only to the fundamental signal component and its distortion. The slow sensing path that has the full VSWR impact does not need an RF harmonic filter since averaging (strong filter) is used.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW include any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage $V_{SOURCE}$ to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
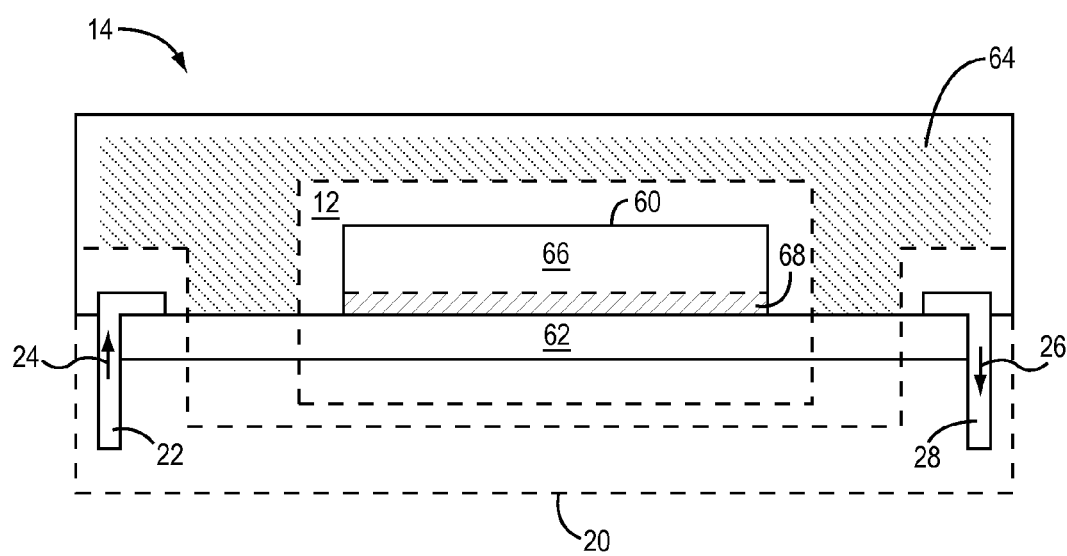
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide ($SiO_x$), Silicon Nitride ($SiN_x$), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

The metallic layers of the package board may be used to form termini, passive impedance components, and connections. For instance, the metallic layers are used form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
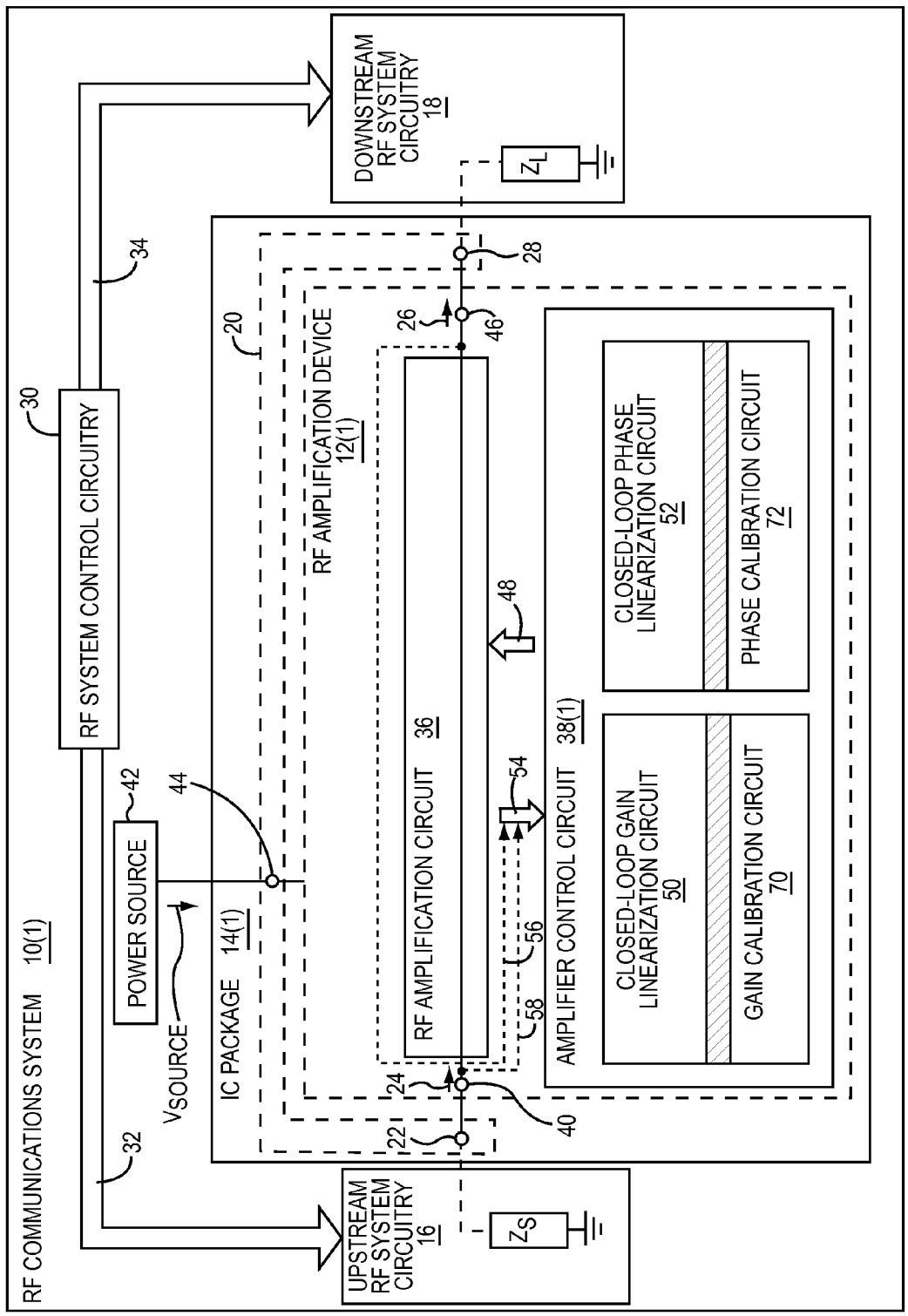
FIG. 3 is a block diagram of another exemplary RF communications system, RF amplification device, and IC package, which are embodiments of the RF communications system, the RF amplification device, and the IC package described above in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
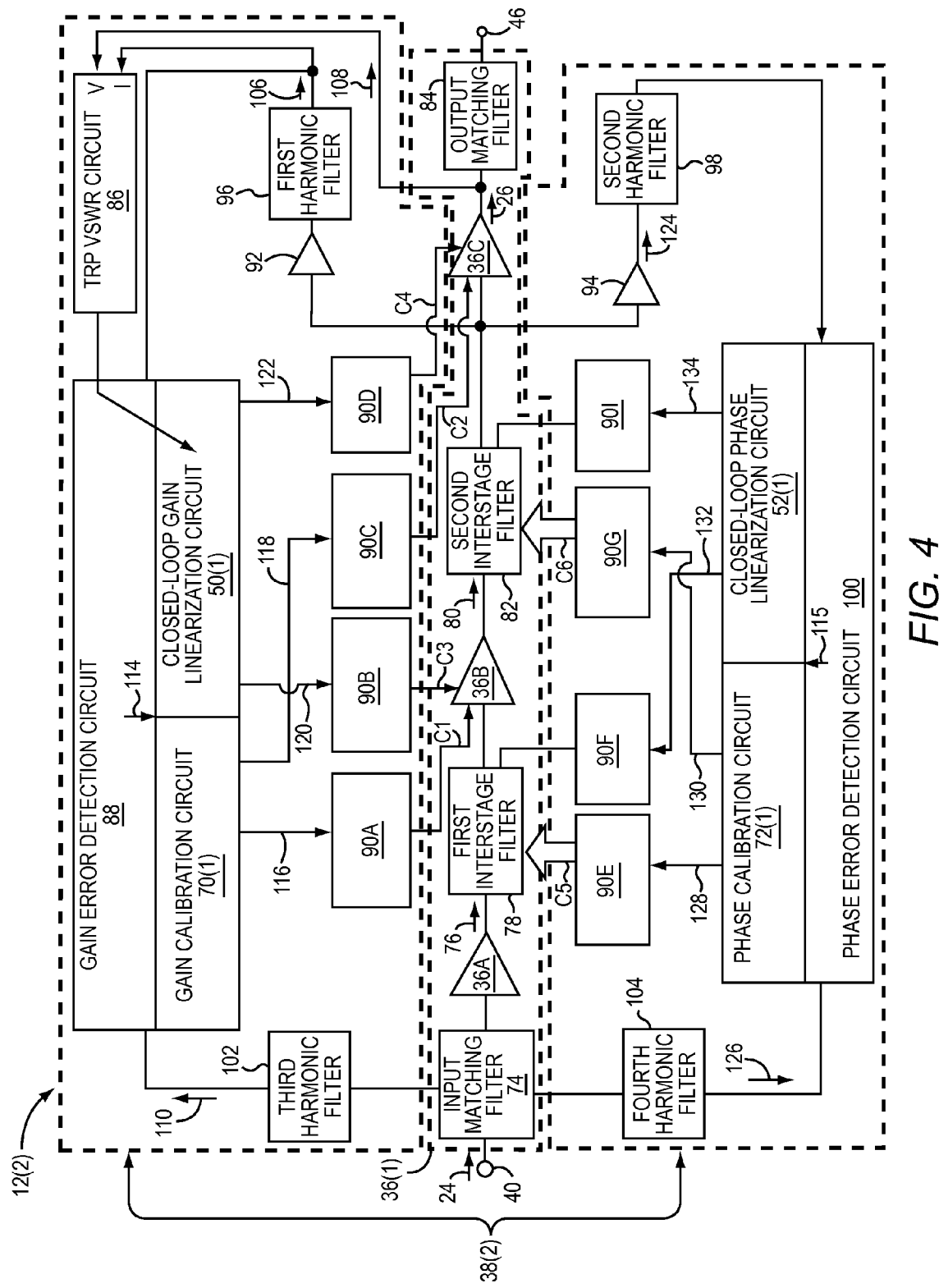
FIG. 4 illustrates a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain $G_{final}$. As such, the gain of the RF amplification circuit 36(1) may be described as $G_{initial}*G_{intermediate}*G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance $Z_L$ (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, a current gain) depending on the topology of each of the corresponding RF amplifier stages 36A, 36B, 36C. For example, the amplifier gain $G_{initial}$, the amplifier gain $G_{intermediate}$, and the amplifier gain $G_{final}$ may each be the same type of amplifier gain or each may be a different types of amplifier gain. As such, the gain of the RF amplification circuit 36(1) may be any type of amplifier gain depending on a combination of the types amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}*G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}*G_{intermediate}$. As such, when the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain ($G_{initial}*G_{intermediate}*G_{final}$) of the RF amplification circuit 36(1). As such, the final RF amplifier stage 36C handles the most power. Furthermore the (total) gain of the RF amplification circuit 36(1) is a transconductance gain.

Alternatively, the amplifier gain $G_{final}$ of the final RF amplifier stage 36C may be a transconductance gain. In this alternative embodiment, the output matching filter 84 may be configured to present an input impedance that converts a current level of the amplified RF signal 26 provided by the final RF amplifier stage 36C into a voltage level. Additionally, in another alternative embodiment, the amplifier gain $G_{intermediate}$ of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a TRP Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement/TRP measurement and adjust a feedback gain of the closed-loop gain linearization circuit 50 in accordance with the VSWR measurement/TRP measurement. For example, the TRP VSWR circuit 86 may be configured to adjust the feedback gain of the closed-loop gain linearization circuit 50 in accordance with the VSWR measurement/TRP measurement so as to maintain an output power level of the amplified RF signal 26 substantially constant over a range of the load impedance $Z_L$ (shown in FIG. 1). The TRP VSWR circuit 86 may be configured to adjust the feedback gain of the closed-loop gain linearization circuit 50 in accordance with the VSWR measurement/TRP measurement so as to maintain the closed-loop gain linearization circuit 50 out of unstable control regions. In order to make the VSWR measurement/TRP measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement/TRP measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement/TRP measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance $Z_L$ (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates an phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88.

As such, in one embodiment of the gain error detection circuit 88, the gain error detection circuit 88 is intended to operate on fundamental components of the first feedback signal 106. Therefore, removing the high-frequency harmonics from the first feedback signal 106 increases the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance $Z_L$ (shown in FIG. 1) is rejected and only the dynamic phase variation, which constitutes distortion, is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100 by operating primarily on the fundamental components of the first feedback signal 106.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance $Z_s$ (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance $Z_s$ (shown in FIG. 1) while the fourth harmonic filter 104 removes unwanted signal components from the second reference signal 126.

Figure 5:
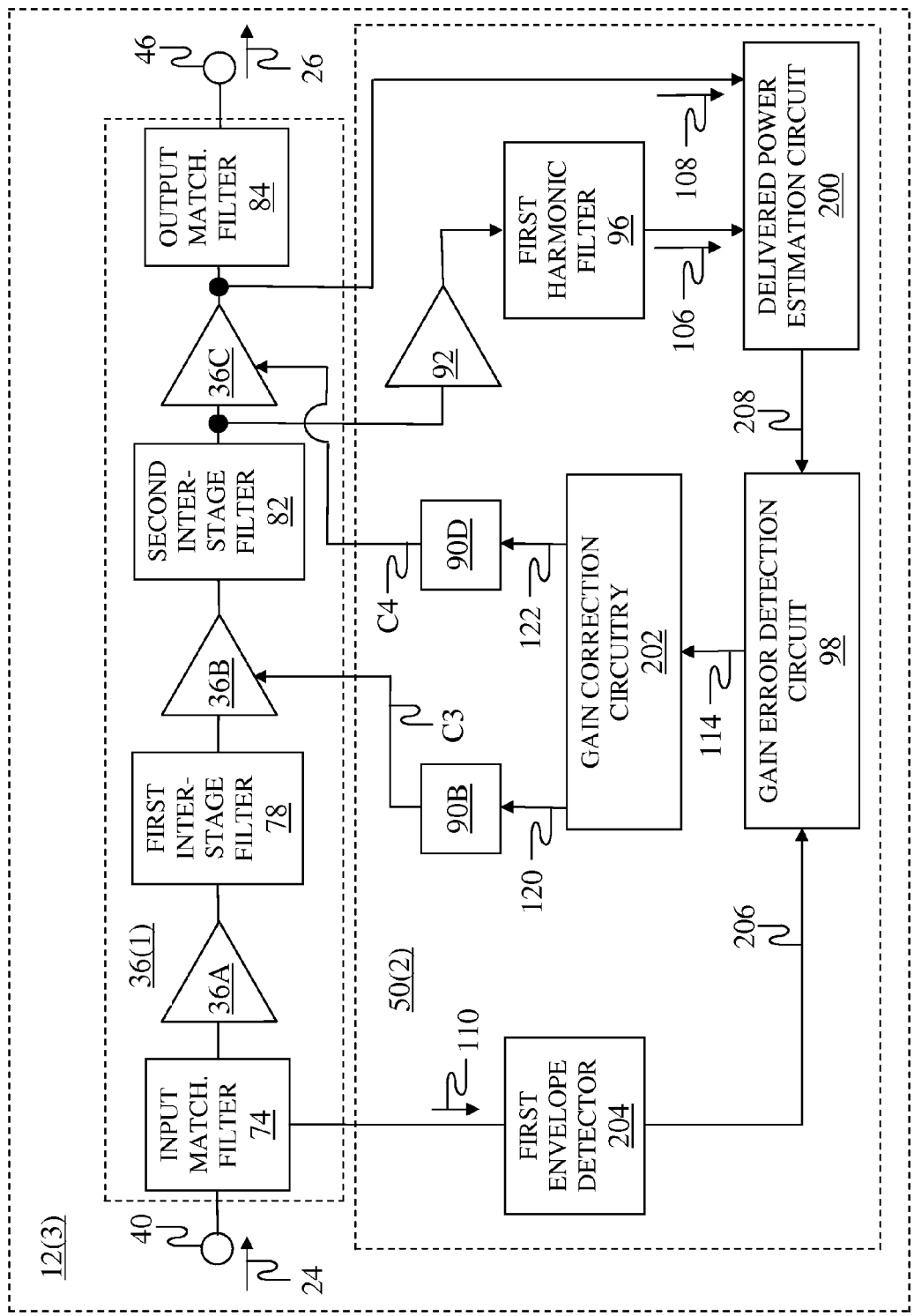
FIG. 5 shows the RF amplification device based on the RF amplification device illustrated in FIG. 1 according to one embodiment of the RF amplification device.

FIG. 5 illustrates details of a partial embodiment of the RF amplification device 12 shown in FIG. 1 according to one embodiment of the RF amplification device 12. The embodiment of the RF amplification device 12(3) illustrated in FIG. 5 includes one embodiment of the RF amplification circuit 36(1) and one embodiment of the closed-loop gain linearization circuit 50(2). The RF amplification circuit 36(1) illustrated in FIG. 5 is similar to the RF amplification circuit 36(1) illustrated in FIG. 4. The closed-loop gain linearization circuit 50(2) illustrated in FIG. 5 shows details of the closed-loop gain linearization circuits 50, 50(1) illustrated in FIGS. 1 and 4, respectively.

The RF amplification circuit 36(1) includes the initial RF amplifier stage 36A, the intermediate RF amplifier stage 36B, the final RF amplifier stage 36C, the input matching filter 74, the first interstage filter 78, the second interstage filter 82, and the output matching filter 84. The initial RF amplifier stage 36A, the intermediate RF amplifier stage 36B, the final RF amplifier stage 36C, the input matching filter 74, the first interstage filter 78, the second interstage filter 82, and the output matching filter 84 are coupled in series between the input terminus 40 and the output terminus 46 to form an amplifier chain. In general, the initial RF amplifier stage 36A, the intermediate RF amplifier stage 36B, and the final RF amplifier stage 36C are coupled in series between the input terminus 40 and the output terminus 46.

Specifically, the input matching filter 74 is coupled between the input terminus 40 and the initial RF amplifier stage 36A. The first interstage filter 78 is coupled between the initial RF amplifier stage 36A and the intermediate RF amplifier stage 36B. The second interstage filter 82 is coupled between the intermediate RF amplifier stage 36B and the final RF amplifier stage 36C. The output matching filter 84 is coupled between the final RF amplifier stage 36C and the output terminus 46. The amplified RF signal 26 is based on the final RF amplifier stage 36C.

The closed-loop gain linearization circuit 50(2) includes the first final stage replica amplifier 92, the first harmonic filter 96, the gain error detection circuit 98, a delivered power estimation circuit 200, gain correction circuitry 202, a first envelope detector 204, the driver stage gain control block 90B, and the final stage gain control block 90D. The first envelope detector 204 is coupled between the input matching filter 74 and the gain error detection circuit 98. The input matching filter 74 provides the first reference signal 110 to the first envelope detector 204, which detects the first reference signal 110 to provide a power reference signal 206 to the gain error detection circuit 98.

In one embodiment of the power reference signal 206, the power reference signal 206 has low distortion, such that the power reference signal 206 is a low distortion power reference signal. In one embodiment of the power reference signal 206, the power reference signal 206 is representative of a target reference power. As such, the target reference power is established based on the RF signal 24. The first final stage replica amplifier 92 is coupled to the final RF amplifier stage 36C. As such, the first final stage replica amplifier 92 approximately replicates the final RF amplifier stage 36C to provide the first feedback signal 106 via the first harmonic filter 96. In one embodiment of the first harmonic filter 96, the first harmonic filter 96 substantially removes harmonics from the first feedback signal 106. Therefore, the first harmonic filter 96 is a harmonic rejection filter to substantially remove harmonics of the RF signal 24. By removing the harmonics of the RF signal 24, the closed-loop gain linearization circuit 50(2) is focused on a fundamental frequency of the RF signal 24.

In one embodiment of the first final stage replica amplifier 92, the first final stage replica amplifier 92 replicates an output current from the final RF amplifier stage 36C. Therefore, an amplitude response in the final RF amplifier stage 36C is approximately replicated in the first final stage replica amplifier 92. However, loading effects presented to an output of the final RF amplifier stage 36C may be avoided by using the first final stage replica amplifier 92. Such effects may include VSWR variations at the output of the final RF amplifier stage 36C. Therefore, using the first final stage replica amplifier 92 may at least partially reject VSWR variations from the first feedback signal 106. In this regard, an amplitude of the first feedback signal 106 is representative of an amplitude of the amplified RF signal 26 and is also representative of the amplitude distortion.

The first harmonic filter 96 is coupled between an output from the first final stage replica amplifier 92 and the delivered power estimation circuit 200. The output of the final RF amplifier stage 36C provides the second feedback signal 108 to the delivered power estimation circuit 200. As such, the delivered power estimation circuit 200 estimates the TRP from the RF amplification circuit 36(1) to create the TRP estimate of the amplified RF signal 26. In this regard, the delivered power estimation circuit 200 determines a measured feedback power based on the TRP estimate. The delivered power estimation circuit 200 provides a power feedback signal 208 to the gain error detection circuit 98. The power feedback signal 208 is representative of the measured feedback power.

In one embodiment of the RF amplification circuit 36(1), an overall amplitude response of the RF amplification circuit 36(1) includes amplitude distortion of the RF amplification circuit 36(1) and a TRP-drift of the RF amplification circuit 36(1). In one embodiment of the amplitude distortion, the amplitude distortion is at least partially based on amplitude variations of the RF signal 24. In one embodiment of the amplitude distortion, a bandwidth of the amplitude distortion is greater than about 100 hertz and less than about 2 gigahertz. In an alternate embodiment of the amplitude distortion, the bandwidth of the amplitude distortion is greater than about 10 kilohertz and less than about 2 gigahertz. In another embodiment of the amplitude distortion, the bandwidth of the amplitude distortion is greater than about 100 kilohertz and less than about 2 gigahertz.

In one embodiment of the TRP-drift, the TRP-drift is at least partially based on VSWR variations presented to an output from the RF amplification circuit 36(1). In one embodiment of the TRP-drift, a bandwidth of the TRP-drift is less than about 100 hertz. In an alternate embodiment of the TRP-drift, the bandwidth of the TRP-drift is less than about 10 kilohertz. In an additional embodiment of the TRP-drift, the bandwidth of the TRP-drift is less than about 100 kilohertz.

In one embodiment of the RF communications system 10 (FIG. 1), in general, the package interface 20 (FIG. 1) receives the RF signal 24 and provides the amplified RF signal 26. The RF amplification circuit 36(1) amplifies the RF signal 24 to generate the amplified RF signal 26. In one embodiment of the gain error detection circuit 98, the gain error detection circuit 98 receives the power reference signal 206 and the power feedback signal 208. The power reference signal 206 is based on the target reference power and the power feedback signal 208 is based on the measured feedback power. The gain error detection circuit 98 provides the gain error signal 114 based on a power difference between the power reference signal 206 and the power feedback signal 208. In general, the closed-loop gain linearization circuit 50(2) reduces the amplitude distortion in the RF amplification circuit 36(1), reduces the TRP-drift in the RF amplification circuit 36(1), or both based on the gain error signal 114.

The gain correction circuitry 202 receives the gain error signal 114 and provides the first gain control signal 120 and the second gain control signal 122 to the driver stage gain control block 90B and the final stage gain control block 90D, respectively, based on the gain error signal 114. In this regard, the gain correction circuitry 202 applies a gain adjustment to the RF amplification circuit 36(1) via the driver stage gain control block 90B and the final stage gain control block 90D based on a power difference between the target reference power of the amplified RF signal 26 and the measured feedback power. As such, the gain adjustment is based on the gain error signal 114. In this regard, the gain adjustment controls the amplitude distortion, the TRP-drift, or both. Further, the gain adjustment may reduce the amplitude distortion, the TRP-drift, or both.

In one embodiment of the RF amplification device 12(3), the first harmonic filter 96 receives and filters a first signal provided by the first final stage replica amplifier 92 that is representative of an amplified RF signal current of the amplified RF signal 26 to provide the first feedback signal 106. A second signal, which is provided by an output from the final RF amplifier stage 36C, is representative of an amplified RF signal voltage of the amplified RF signal 26. The second signal is provided to the delivered power estimation circuit 200 as the second feedback signal 108. The delivered power estimation circuit 200 substantially ignores amplitude variations in the second signal having a bandwidth greater than a bandwidth of the TRP-drift.

The delivered power estimation circuit 200 estimates the TRP using the first feedback signal 106 and the second signal to provide the TRP estimate and provide the power feedback signal 208 based on the TRP estimate. In an alternate embodiment of the first signal and the second signal, the first signal is representative of the amplified RF signal voltage and the second signal is representative of the amplified RF signal current.

Figure 6:
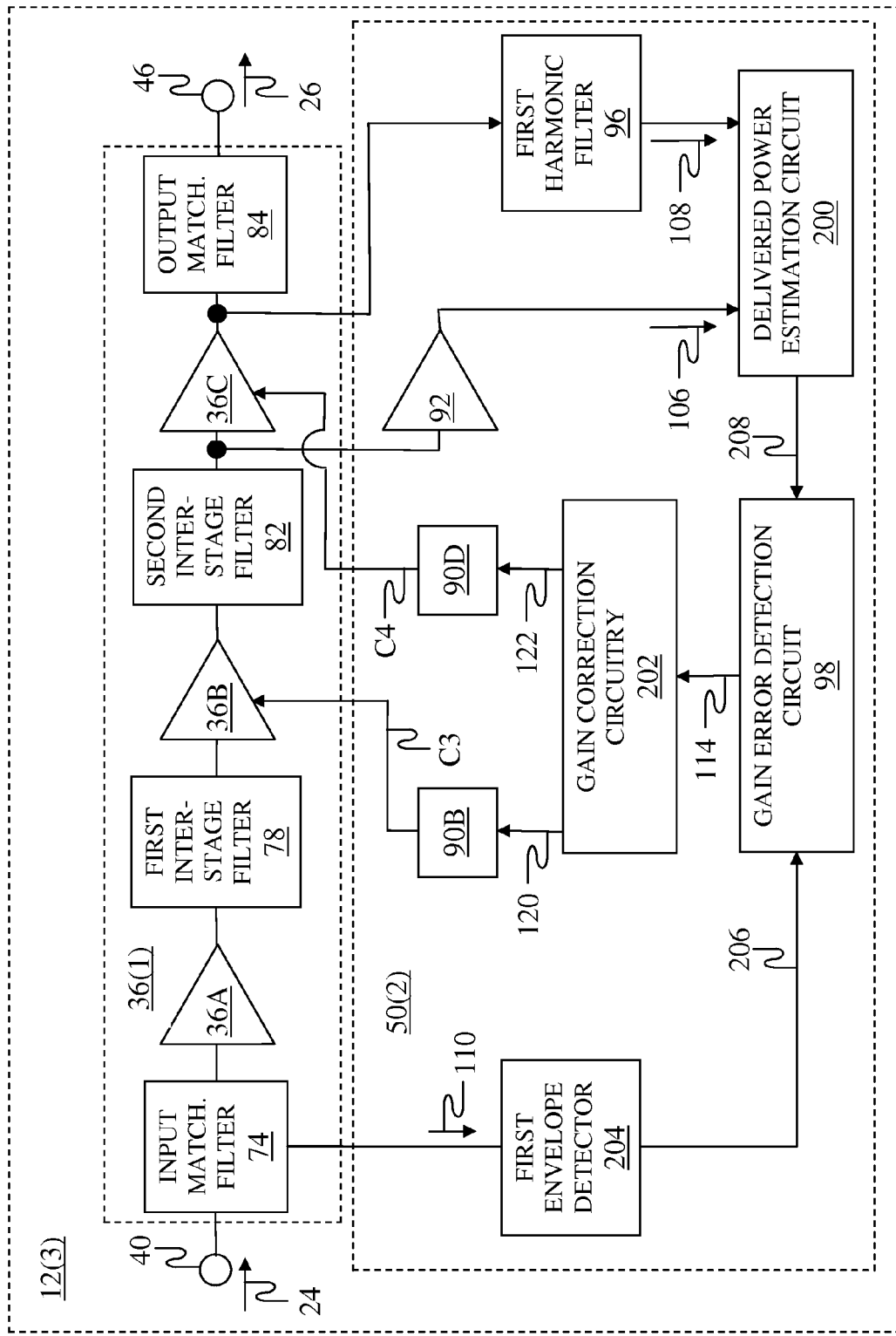
FIG. 6 shows the RF amplification device based on the RF amplification device illustrated in FIG. 1 according to an additional embodiment of the RF amplification device.

FIG. 6 shows the RF amplification device 12(3) based on the RF amplification device 12 illustrated in FIG. 1 according to an alternate embodiment of the RF amplification device 12(3). The RF amplification device 12(3) illustrated in FIG. 6 is similar to the RF amplification device 12(3) illustrated in FIG. 5, except in the RF amplification device 12(3) illustrated in FIG. 6, the first harmonic filter 96 is coupled between the output from the final RF amplifier stage 36C and the delivered power estimation circuit 200 instead of being coupled between the first final stage replica amplifier 92 and the delivered power estimation circuit 200.

The first harmonic filter 96 receives and filters the second signal provided by the output from the final RF amplifier stage 36C that is representative of the amplified RF signal voltage of the amplified RF signal 26 to provide the second feedback signal 108. The first signal, which is provided by the first final stage replica amplifier 92, is representative of the amplified RF signal current of the amplified RF signal 26. The first signal is provided to the delivered power estimation circuit 200 as the first feedback signal 106. The delivered power estimation circuit 200 substantially ignores amplitude variations in the first signal having a bandwidth greater than a bandwidth of the TRP-drift.

Figure 7:
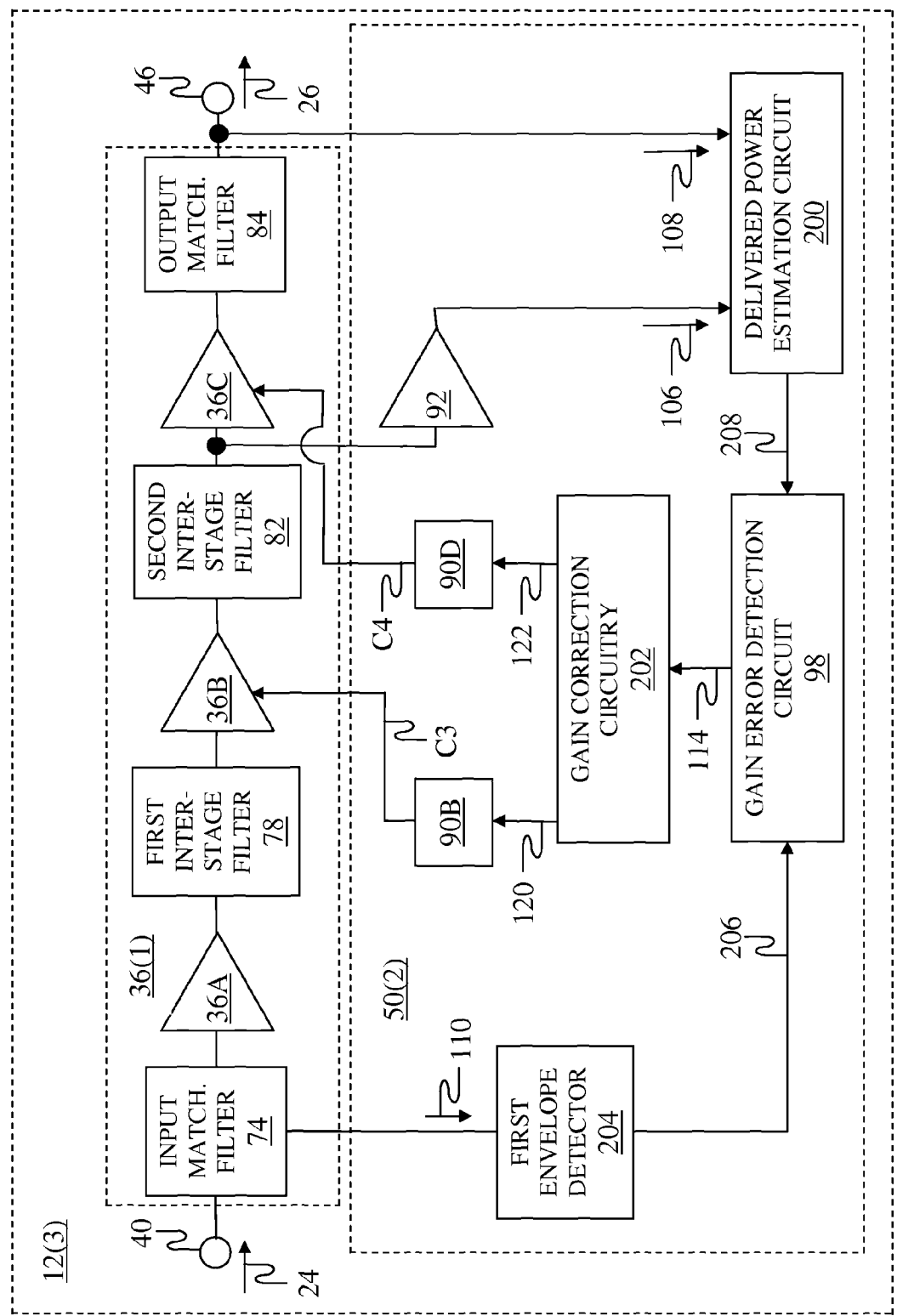
FIG. 7 shows the RF amplification device based on the RF amplification device illustrated in FIG. 1 according to an alternate embodiment of the RF amplification device.

FIG. 7 shows the RF amplification device 12(3) based on the RF amplification device 12 illustrated in FIG. 1 according to an additional embodiment of the RF amplification device 12(3). The RF amplification device 12(3) illustrated in FIG. 7 is similar to the RF amplification device 12(3) illustrated in FIG. 6, except in the RF amplification device 12(3) illustrated in FIG. 7, the first harmonic filter 96 is omitted and the second feedback signal 108 is provided by an output from the output matching filter 84. In this regard, the output matching filter 84 may provide some harmonic rejection filtering, thereby rendering the first harmonic filter 96 unnecessary.

The first signal, which is provided by the first final stage replica amplifier 92, is representative of the amplified RF signal current of the amplified RF signal 26. The first signal is provided to the delivered power estimation circuit 200 as the first feedback signal 106. The second signal, which is provided by the output matching filter 84, is representative of the amplified RF signal voltage of the amplified RF signal 26. The second signal is provided to the delivered power estimation circuit 200 as the second feedback signal 108. The delivered power estimation circuit 200 substantially ignores amplitude variations in the first signal having a bandwidth greater than a bandwidth of the TRP-drift.

Figure 8:
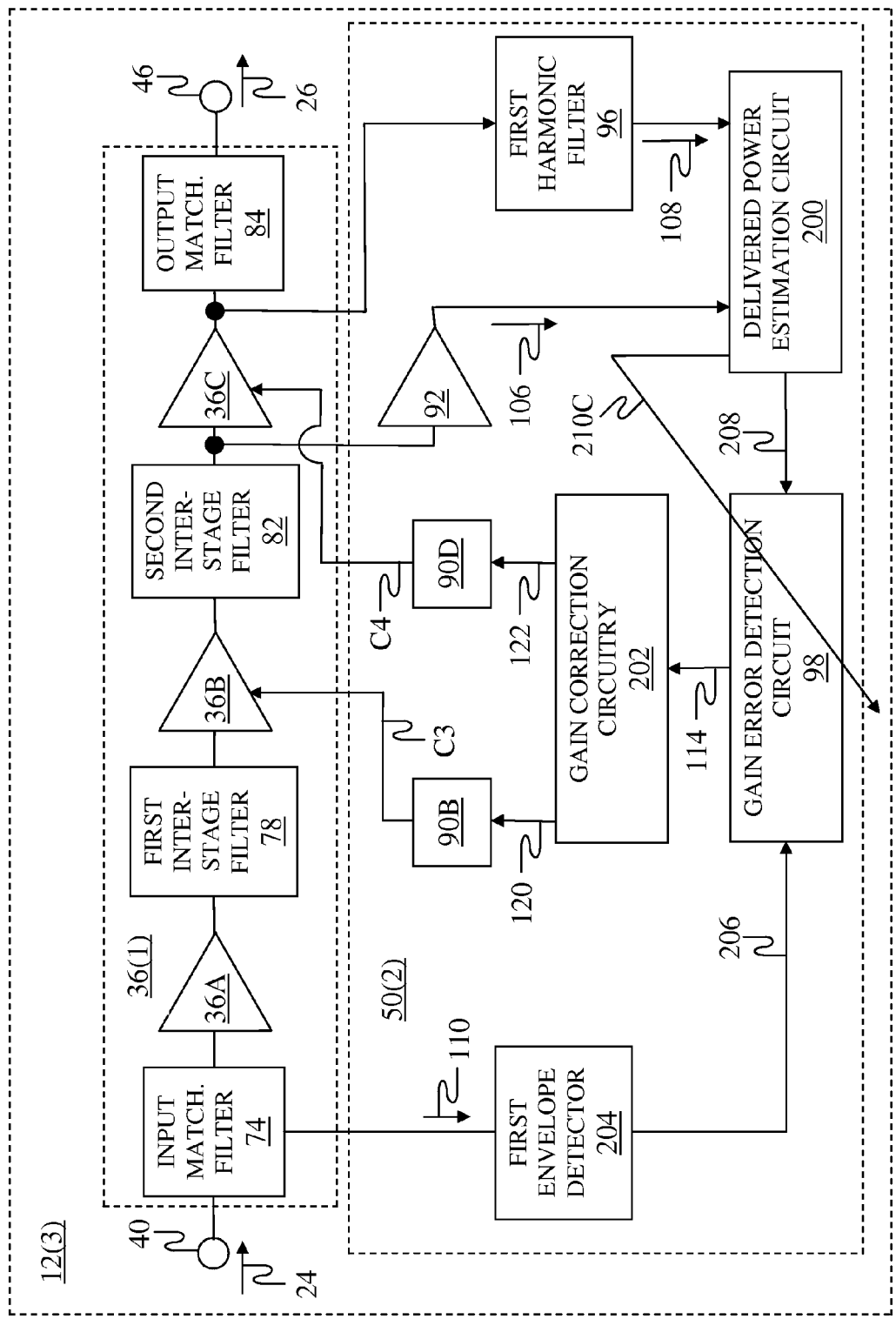
FIG. 8 shows the RF amplification device based on the RF amplification device illustrated in FIG. 1 according to another embodiment of the RF amplification device.

FIG. 8 shows the RF amplification device 12(3) based on the RF amplification device 12 illustrated in FIG. 1 according to another embodiment of the RF amplification device 12(3). The RF amplification device 12(3) illustrated in FIG. 8 is similar to the RF amplification device 12(3) illustrated in FIG. 6, except in the RF amplification device 12(3) illustrated in FIG. 8, the delivered power estimation circuit 200 provides and adjusts a first open-loop control signal 210C to the gain error detection circuit 98 to properly align a closed loop response of the RF amplification circuit 36(1) with an open loop response of the RF amplification circuit 36(1).

Figure 9:
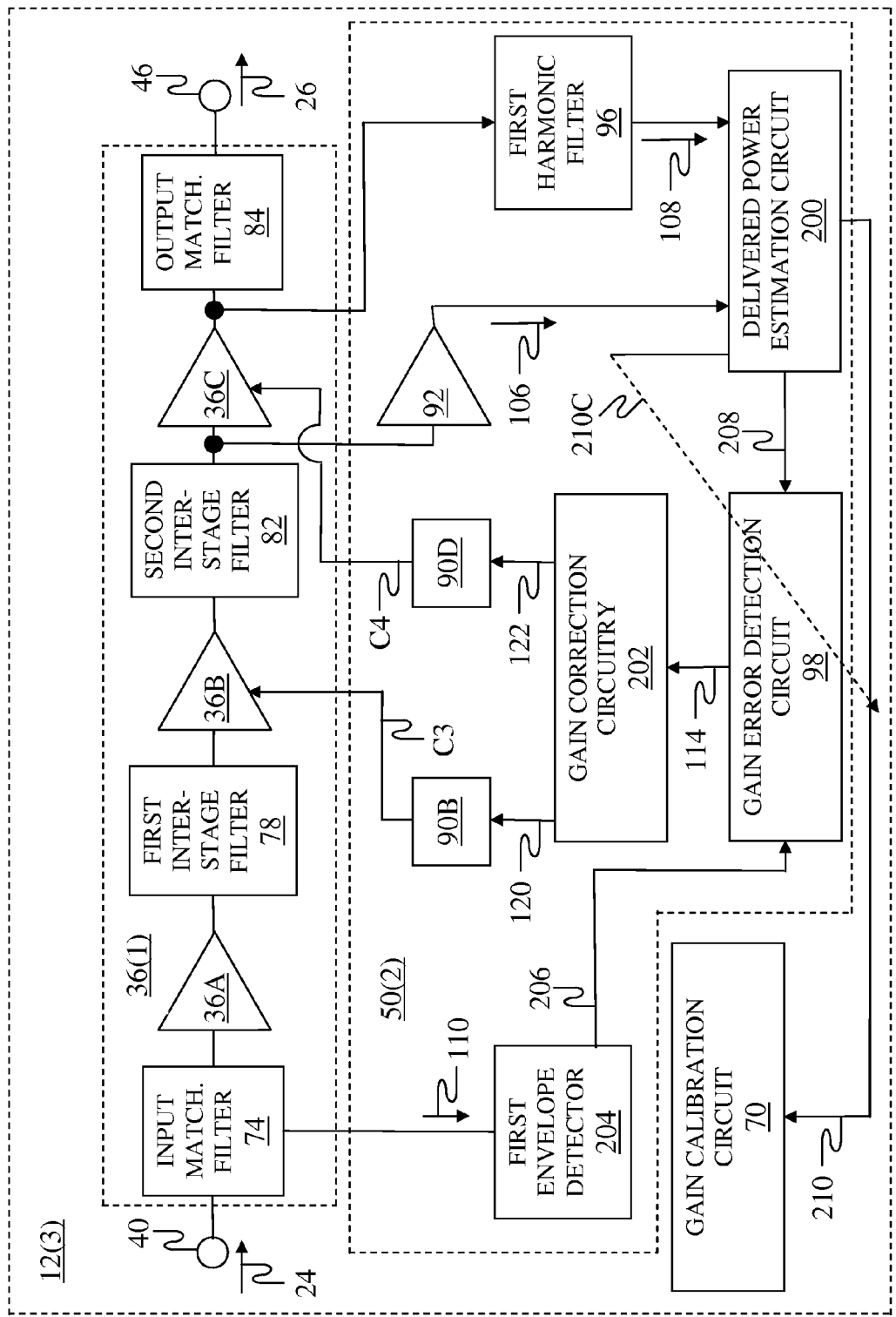
FIG. 9 shows the RF amplification device based on the RF amplification device illustrated in FIG. 1 according to a further embodiment of the RF amplification device.

FIG. 9 shows the RF amplification device 12(3) based on the RF amplification device 12 illustrated in FIG. 1 according to a further embodiment of the RF amplification device 12(3). The RF amplification device 12(3) illustrated in FIG. 9 is similar to the RF amplification device 12(3) illustrated in FIG. 8, except in the RF amplification device 12(3) illustrated in FIG. 9, the delivered power estimation circuit 200 provides and adjusts a second open-loop control signal 210 to the gain calibration circuit 70 (FIG. 3) in addition to providing and adjusting the first open-loop control signal 210C to properly align the closed loop response of the RF amplification circuit 36(1) with the open loop response of the RF amplification circuit 36(1).

Figure 10:
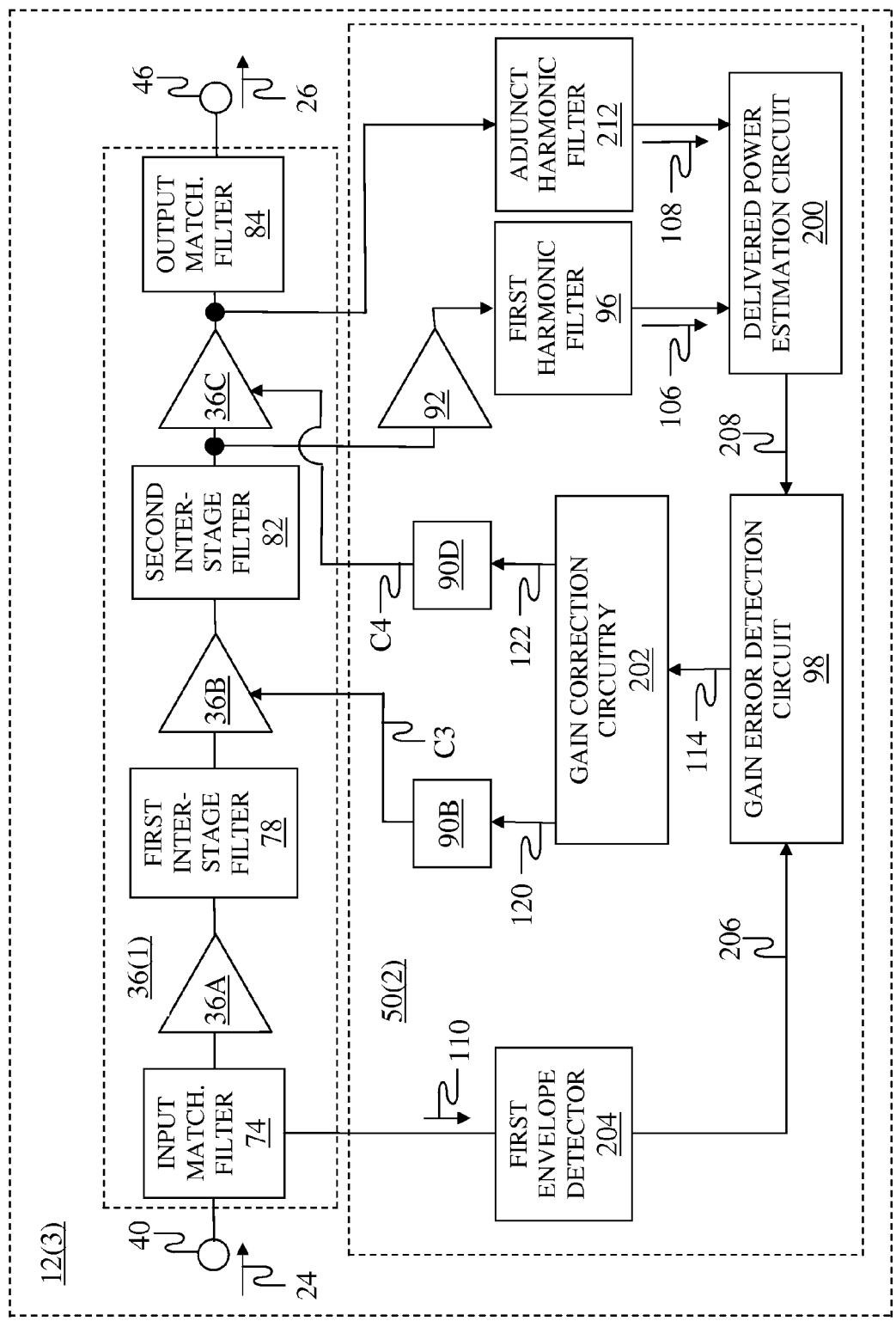
FIG. 10 shows the RF amplification device based on the RF amplification device illustrated in FIG. 1 according to an adjunct embodiment of the RF amplification device.

FIG. 10 shows the RF amplification device 12(3) based on the RF amplification device 12 illustrated in FIG. 1 according to an adjunct embodiment of the RF amplification device 12(3). The RF amplification device 12(3) illustrated in FIG. 10 is similar to the RF amplification device 12(3) illustrated in FIG. 5, except in the RF amplification device 12(3) illustrated in FIG. 10, the closed-loop gain linearization circuit 50(2) further includes an adjunct harmonic filter 212 coupled between an output from the final RF amplifier stage 36C and the delivered power estimation circuit 200. The first harmonic filter 96 receives and filters a signal that is representative of an amplified RF signal current in the amplified RF signal 26 to provide the first feedback signal 106. The adjunct harmonic filter 212 receives and filters a signal that is representative of an amplified RF signal voltage in the amplified RF signal 26 to provide the second feedback signal 108. The delivered power estimation circuit 200 estimates the TRP using the first feedback signal 106 and the second feedback signal 108 to provide the TRP estimate. The delivered power estimation circuit 200 provides the power feedback signal 208 based on the TRP estimate.

Figure 11:
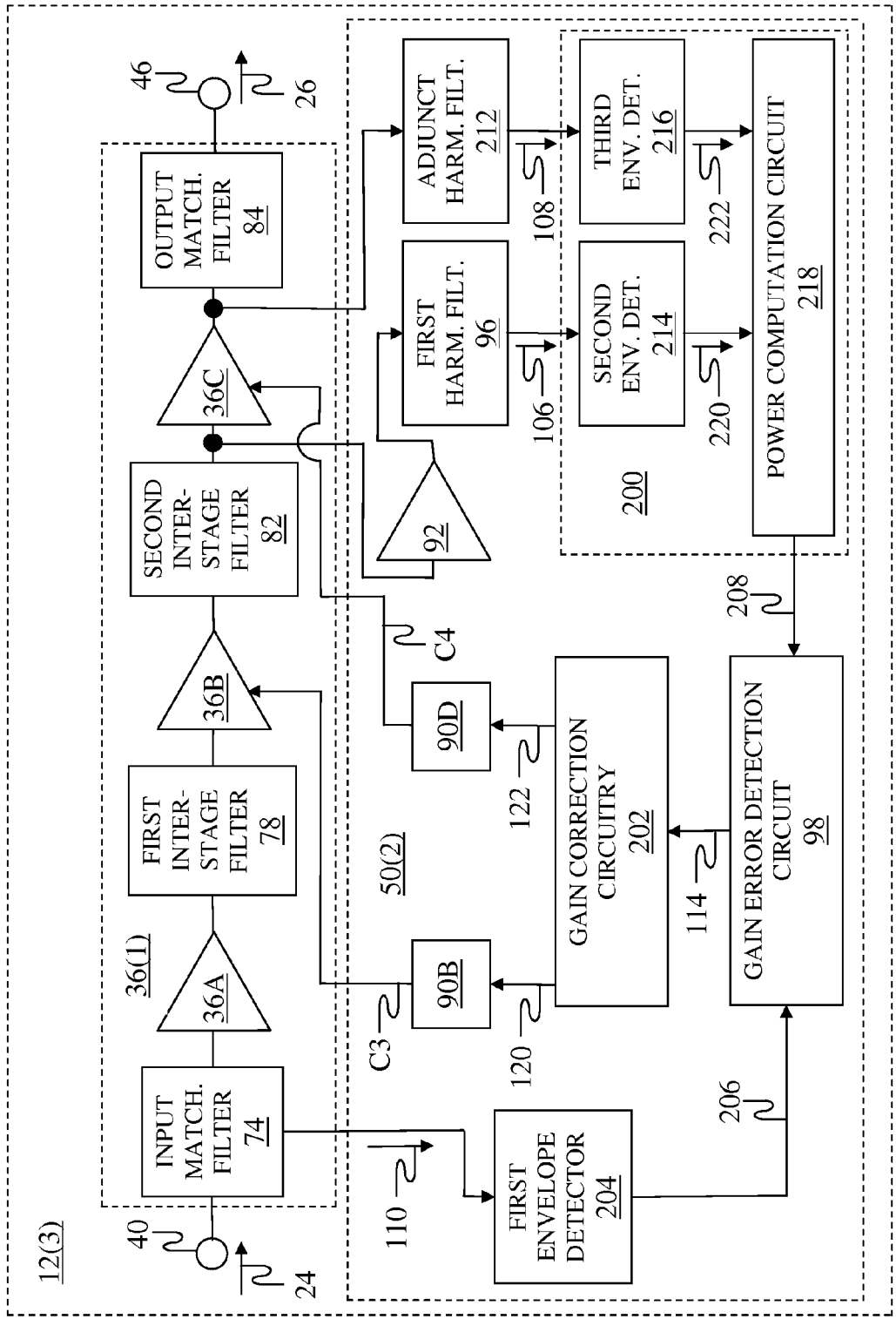
FIG. 11 shows the RF amplification device based on the RF amplification device illustrated in FIG. 1 according to one embodiment of the RF amplification device.

FIG. 11 shows the RF amplification device 12(3) based on the RF amplification device 12 illustrated in FIG. 1 according to an alternate embodiment of the RF amplification device 12(3). The RF amplification device 12(3) illustrated in FIG. 11 is similar to the RF amplification device 12(3) illustrated in FIG. 10, except in the RF amplification device 12(3) illustrated in FIG. 11, the delivered power estimation circuit 200 includes a second envelope detector 214, a third envelope detector 216, and a power computation circuit 218.

The second envelope detector 214 receives and detects the first feedback signal 106 to provide a detected current signal 220. The third envelope detector 216 receives and detects the second feedback signal 108 to provide a detected voltage signal 222. The power computation circuit 218 estimates the TRP using the detected current signal 220 and the detected voltage signal 222 to provide the TRP estimate. Since the detected current signal 220 and the detected voltage signal 222 are both baseband signals, no down-conversion is needed in the power computation circuit 218. The delivered power estimation circuit 200 provides the power feedback signal 208 based on the TRP estimate.

Figure 12:
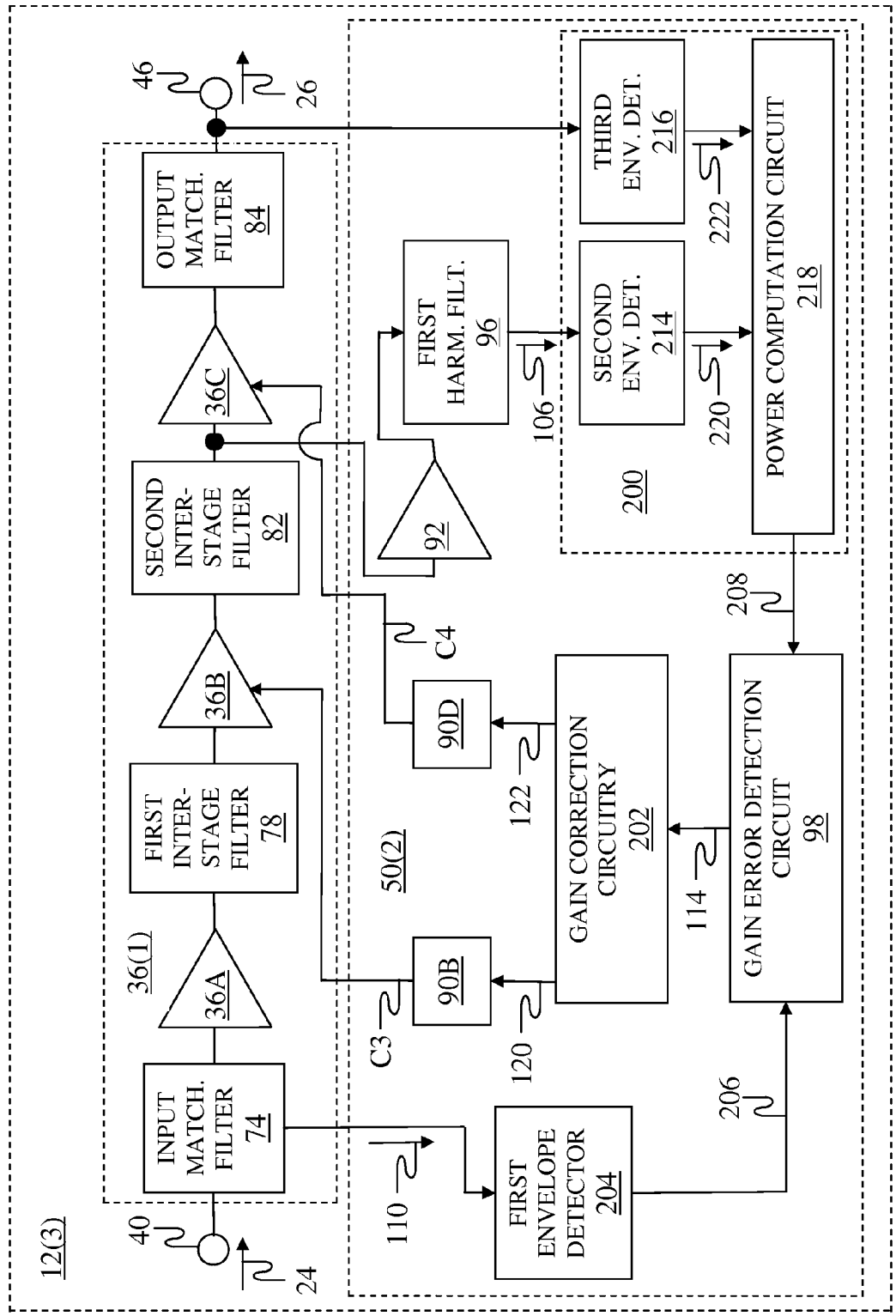
FIG. 12 shows the RF amplification device based on the RF amplification device illustrated in FIG. 1 according to an additional embodiment of the RF amplification device.

FIG. 12 shows the RF amplification device 12(3) based on the RF amplification device 12 illustrated in FIG. 1 according to an additional embodiment of the RF amplification device 12(3). The RF amplification device 12(3) illustrated in FIG. 12 is similar to the RF amplification device 12(3) illustrated in FIG. 11, except in the RF amplification device 12(3) illustrated in FIG. 12, the adjunct harmonic filter 212 is omitted. Additionally, the third envelope detector 216 receives and detects the amplified RF signal 26 via the output matching filter 84 to provide the detected voltage signal 222. The power computation circuit 218 estimates the TRP using the detected current signal 220 and the detected voltage signal 222 to provide the TRP estimate. The delivered power estimation circuit 200 provides the power feedback signal 208 based on the TRP estimate. Delay in the output matching filter 84 may cause a timing mismatch between the amplified RF signal 26 and the first feedback signal 106. As a result, timing delays in the second envelope detector 214 and the third envelope detector 216 may need to be mismatched be to compensate for the timing mismatch between the amplified RF signal 26 and the first feedback signal 106 to provide accurate timing between the detected current signal 220 and the detected voltage signal 222

Figure 13:
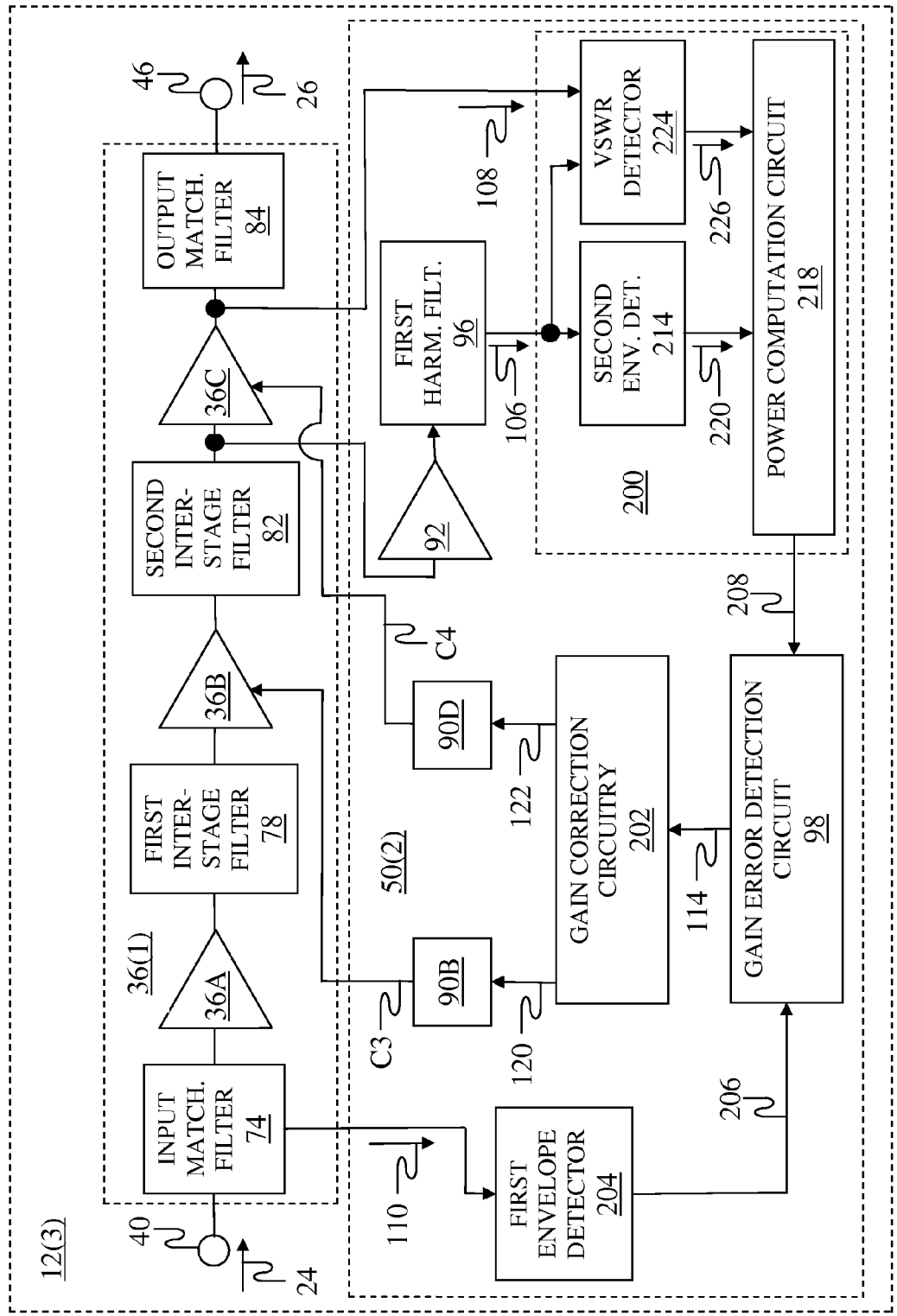
FIG. 13 shows the RF amplification device based on the RF amplification device illustrated in FIG. 1 according to an alternate embodiment of the RF amplification device.

FIG. 13 shows the RF amplification device 12(3) based on the RF amplification device 12 illustrated in FIG. 1 according to another embodiment of the RF amplification device 12(3). The RF amplification device 12(3) illustrated in FIG. 13 is similar to the RF amplification device 12(3) illustrated in FIG. 12, except in the RF amplification device 12(3) illustrated in FIG. 13, the output from the final RF amplifier stage 36C provides the second feedback signal 108. In this regard, the first feedback signal 106 is representative of the amplified RF signal current and the second feedback signal 108 is representative of the amplified RF signal voltage.

The delivered power estimation circuit 200 includes the second envelope detector 214, the power computation circuit 218, and a VSWR detector 224. The second envelope detector 214 receives and detects the first feedback signal 106 to provide the detected current signal 220. The VSWR detector 224 receives the first feedback signal 106 and the second feedback signal 108 to determine a VSWR of the RF amplification circuit 36(1) based on the first feedback signal 106 and the second feedback signal 108. The VSWR detector 224 provides a voltage based VSWR signal 226 to the power computation circuit 218 based on the VSWR. The power computation circuit 218 estimates the TRP using the detected current signal 220 and the voltage based VSWR signal 226. The power computation circuit 218 provides the power feedback signal 208 based on the TRP estimate. In an alternate embodiment of the VSWR detector 224, the VSWR detector 224 does not receive or use the first feedback signal 106 to determine the VSWR.

Figure 14:
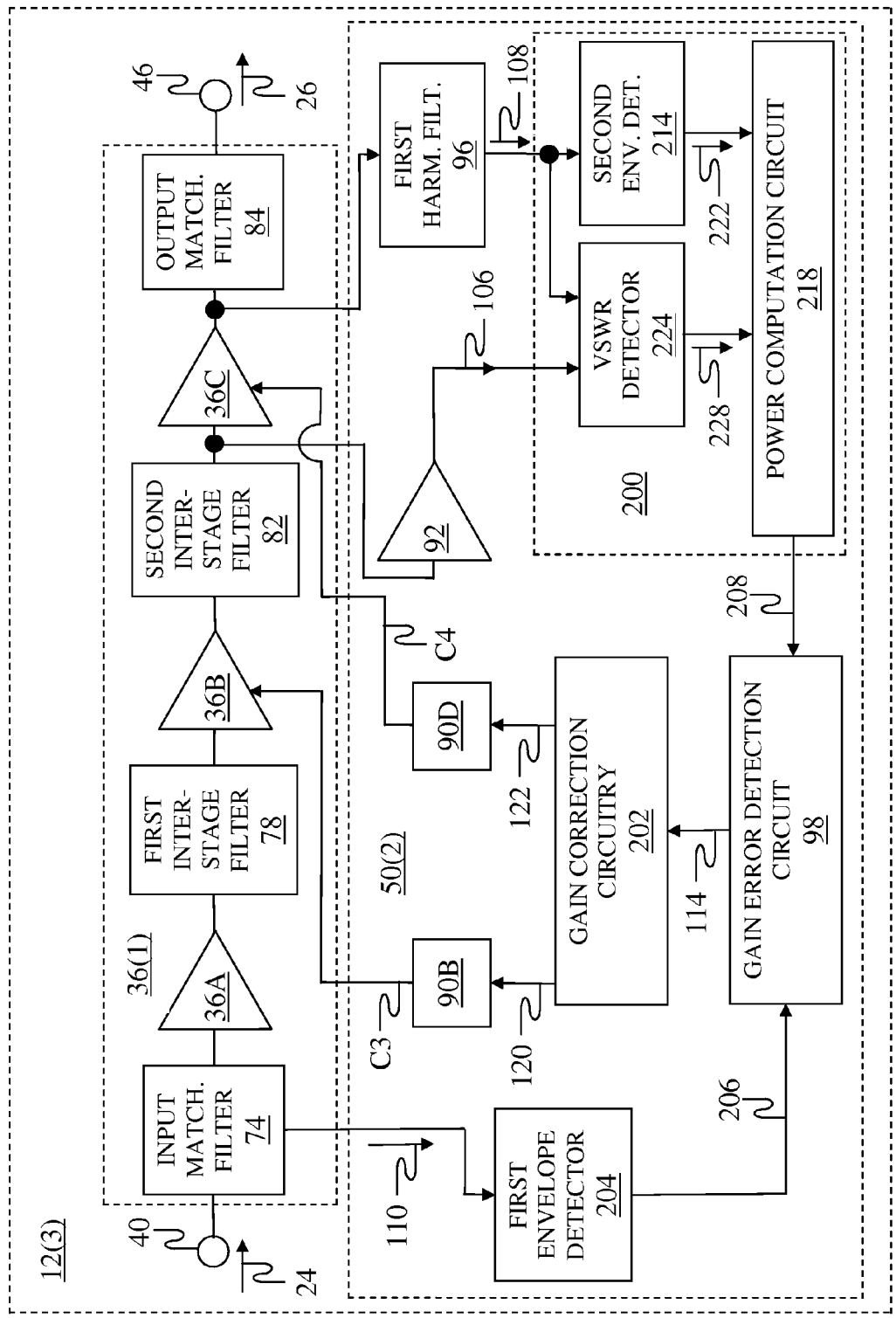
FIG. 14 shows the RF amplification device based on the RF amplification device illustrated in FIG. 1 according to another embodiment of the RF amplification device.

FIG. 14 shows the RF amplification device 12(3) based on the RF amplification device 12 illustrated in FIG. 1 according to a further embodiment of the RF amplification device 12(3). The RF amplification device 12(3) illustrated in FIG. 14 is similar to the RF amplification device 12(3) illustrated in FIG. 13, except in the RF amplification device 12(3) illustrated in FIG. 14, the first harmonic filter 96 is coupled to the output from the final RF amplifier stage 36C instead of being coupled to the output from the first final stage replica amplifier 92. As such, the first final stage replica amplifier 92 directly provides the first feedback signal 106 and the first harmonic filter 96 provides the second feedback signal 108.

The VSWR detector 224 receives the first feedback signal 106 and the second feedback signal 108 to determine the VSWR of the RF amplification circuit 36(1) based on the first feedback signal 106 and the second feedback signal 108. The VSWR detector 224 provides a current based VSWR signal 228 to the power computation circuit 218 based on the VSWR. However, the second envelope detector 214 receives and detects the second feedback signal 108 to provide the detected voltage signal 222. The power computation circuit 218 estimates the TRP using the detected voltage signal 222 and the current based VSWR signal 228. The power computation circuit 218 provides the power feedback signal 208 based on the TRP estimate. In an alternate embodiment of the VSWR detector 224, the VSWR detector 224 does not receive or use the second feedback signal 108 to determine the VSWR. The power computation circuit 218 estimates the TRP using the detected voltage signal 222 and the current based VSWR signal 228.

Figure 15:
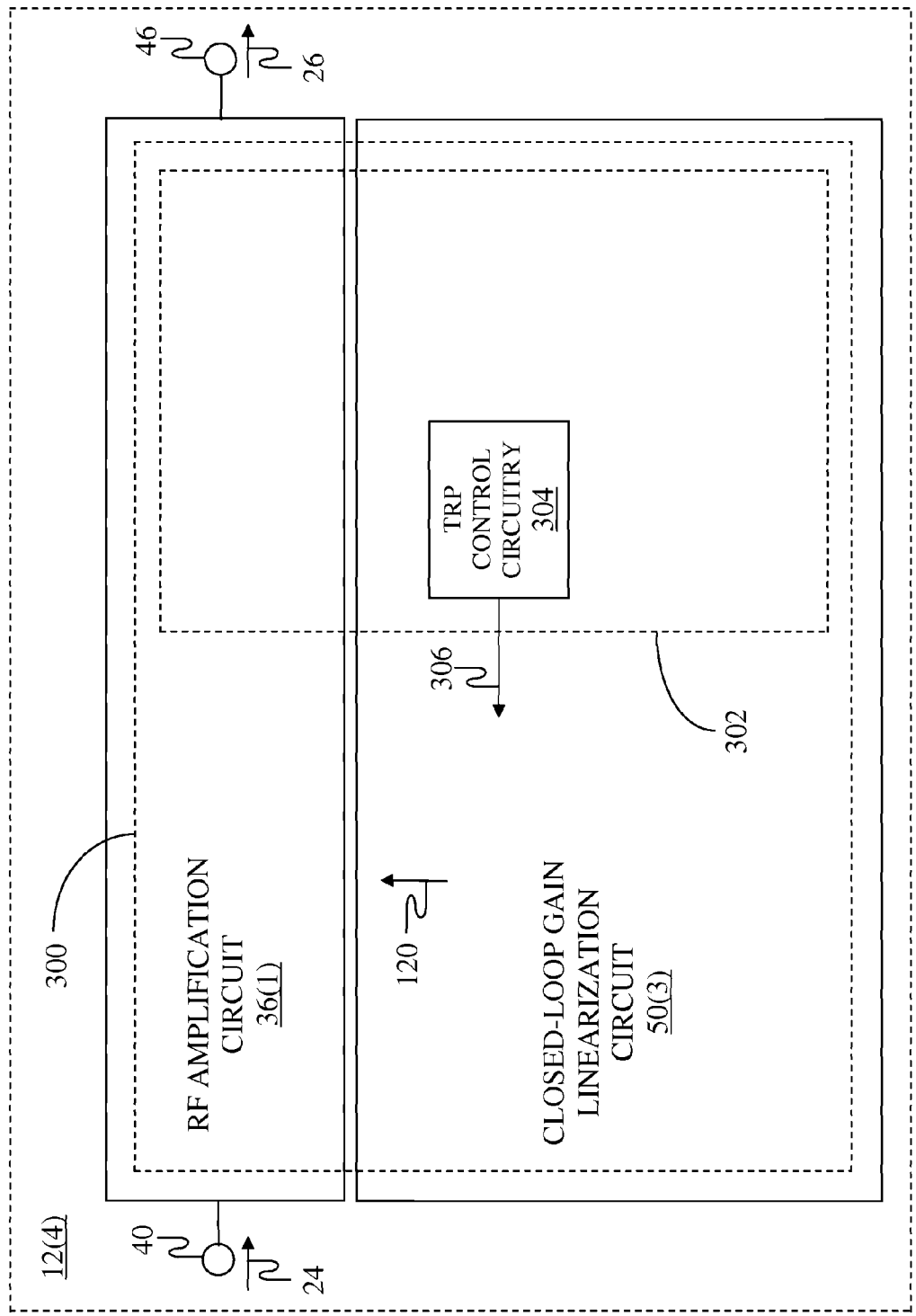
FIG. 15 shows the RF amplification device based on the RF amplification device illustrated in FIG. 1 according to a further embodiment of the RF amplification device.

FIG. 15 shows an RF amplification device 12(4) based on the RF amplification device 12 illustrated in FIG. 1 according to one embodiment of the RF amplification device 12(4). The RF amplification device 12(4) includes a closed-loop gain linearization circuit 50(3) and the RF amplification circuit 36(1). The RF amplification circuit 36(1) illustrated in FIG. 15 is similar to the RF amplification circuit 36(1) illustrated in FIG. 4. The closed-loop gain linearization circuit 50(3) illustrated in FIG. 15 shows details of the closed-loop gain linearization circuits 50, 50(1) illustrated in FIGS. 1 and 4, respectively. The RF amplification circuit 36(1) and the closed-loop gain linearization circuit 50(3) form a fast control loop 300 and a slow control loop 302. The RF amplification circuit 36(1) amplifies the RF signal 24 to generate the amplified RF signal 26. The fast control loop 300 and the slow control loop 302 include TRP control circuitry 304, which provides a fast loop gain control signal 306.

The slow control loop 302 estimates a TRP from the RF amplification circuit 36(1) to create a TRP estimate using a representation of the amplified RF signal 26. In one embodiment of the representation of the amplified RF signal 26, the representation of the amplified RF signal 26 is the amplified RF signal 26. In addition, the slow control loop 302 controls a fast loop gain of the fast control loop 300 based on the TRP estimate.

The fast control loop 300 applies a gain adjustment to the RF amplification circuit 36(1) based on the fast loop gain and a difference between a target reference amplitude and a measured feedback amplitude, such that the gain adjustment controls amplitude distortion in the RF amplification circuit 36(1) and the slow control loop 302 controls TRP-drift in the RF amplification circuit 36(1). The gain adjustment is based on at least the first gain control signal 120.

In one embodiment of the IC package 14 (FIG. 1), the IC package 14 (FIG. 1) includes the RF amplification device 12(4) and the package interface 20 (FIG. 1). As mentioned above, the RF amplification device 12(4) includes the closed-loop gain linearization circuit 50(3) and the RF amplification circuit 36(1). In this regard, the IC package 14 (FIG. 1) receives the RF signal 24 and provides the amplified RF signal 26. As such, the slow control loop 302 endogenously estimates the TRP from the RF amplification circuit 36(1).

The amplitude distortion is at least partially based on amplitude variations of the RF signal 24 and the TRP-drift is at least partially based on VSWR variations presented to an output from the RF amplification circuit 36(1). In one embodiment of the fast control loop 300 and the slow control loop 302, a bandwidth of the slow control loop 302 is less than about 100 hertz, and a bandwidth of the fast control loop 300 is greater than about 100 hertz and less than about one gigahertz. In an alternate embodiment of the fast control loop 300 and the slow control loop 302, the bandwidth of the slow control loop 302 is less than about 10 kilohertz, and the bandwidth of the fast control loop 300 is greater than about 10 kilohertz and less than about two gigahertz. In another embodiment of the fast control loop 300 and the slow control loop 302, the bandwidth of the slow control loop 302 is less than about 100 kilohertz, and the bandwidth of the fast control loop 300 is greater than about 100 kilohertz and less than about two gigahertz.

Figure 16:
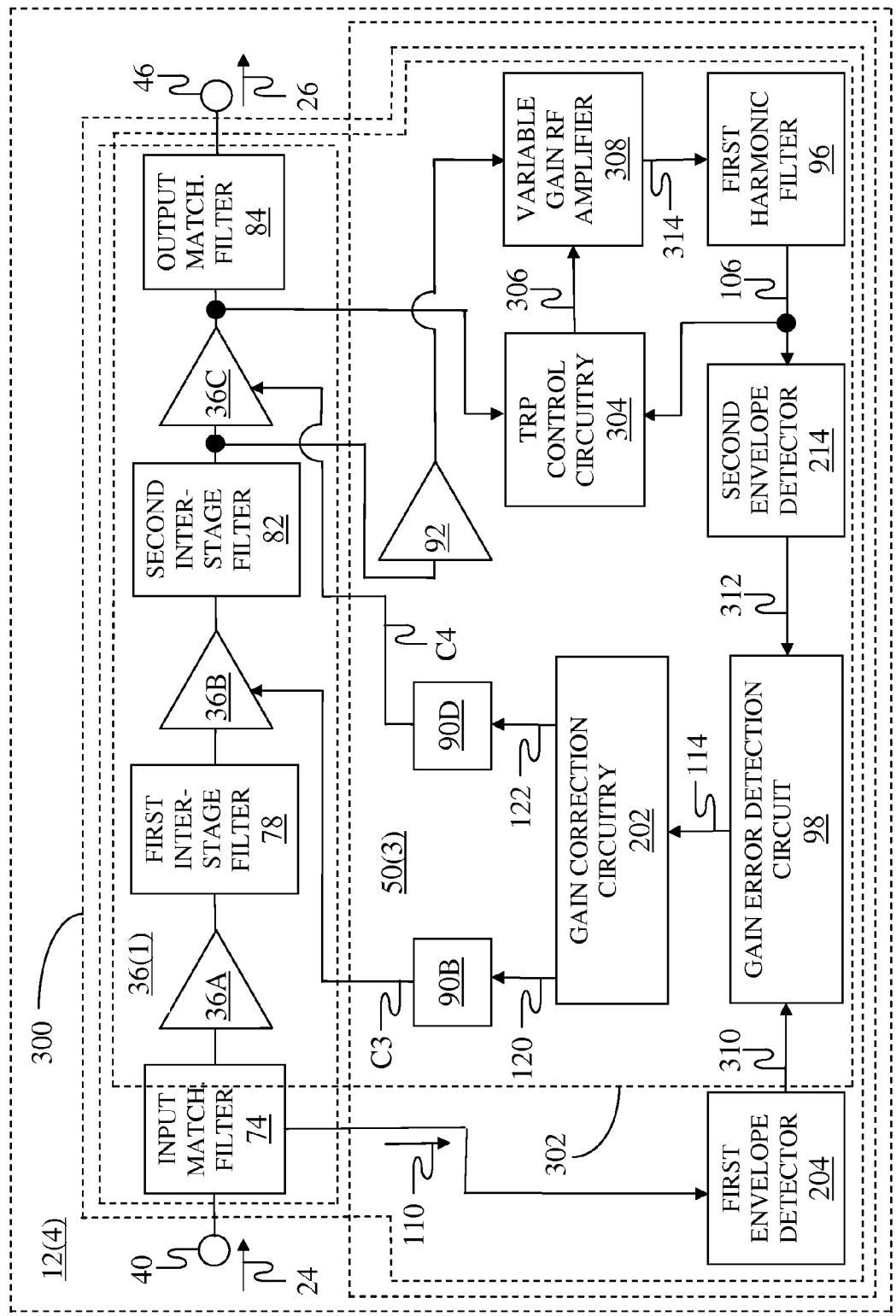
FIG. 16 shows the RF amplification device based on the RF amplification device illustrated in FIG. 1 according to an adjunct embodiment of the RF amplification device.

FIG. 16 shows details of the RF amplification device 12(4) based on the RF amplification device 12(4) illustrated in FIG. 15 according to an alternate embodiment of the RF amplification device 12(4). The RF amplification device 12(4) includes the RF amplification circuit 36(1) and the closed-loop gain linearization circuit 50(3). The RF amplification circuit 36(1) illustrated in FIG. 16 is similar to the RF amplification circuit 36(1) illustrated in FIG. 14. The closed-loop gain linearization circuit 50(3) illustrated in FIG. 16 is similar to the closed-loop gain linearization circuit 50(2) illustrated I FIG. 14, except in the closed-loop gain linearization circuit 50(3) illustrated in FIG. 16, the delivered power estimation circuit 200 is omitted, and the gain error detection circuit 98 receives a amplitude reference signal 310 and a envelope amplitude feedback signal 312 instead of receiving the power reference signal 206 and the power feedback signal 208, respectively.

Additionally, the closed-loop gain linearization circuit 50(3) further includes the TRP control circuitry 304, a variable gain RF amplifier 308, and the second envelope detector 214. The TRP control circuitry 304 is coupled to an output from the final RF amplifier stage 36C and to an output from the first harmonic filter 96. The variable gain RF amplifier 308 is coupled between an output from first final stage replica amplifier 92 and the first harmonic filter 96. The second envelope detector 214 is coupled between an output from the first harmonic filter 96 and the gain error detection circuit 98.

The first final stage replica amplifier 92 provides a first signal, which is representative of an amplified RF signal current of the amplified RF signal 26, to the variable gain RF amplifier 308. The TRP control circuitry 304 provides the fast loop gain control signal 306 to the variable gain RF amplifier 308 based on the first signal and a second signal, such that a gain of the variable gain RF amplifier 308 is based on the fast loop gain control signal 306. The variable gain RF amplifier 308 amplifies the first signal to provide an amplified feedback signal 314 to the first harmonic filter 96 based on the gain of the variable gain RF amplifier 308. The first harmonic filter 96 filters out harmonics of the amplified feedback signal 314 to provide the first feedback signal 106. The second envelope detector 214 receives and detects the first feedback signal 106 to provide the envelope amplitude feedback signal 312. The first envelope detector 204 receives and detects the first reference signal 110 to provide the amplitude reference signal 310.

The final RF amplifier stage 36C provides a second signal, which is representative of an amplified RF signal voltage of the amplified RF signal 26, to the TRP control circuitry 304. Additionally, the TRP control circuitry 304 receives the first feedback signal 106. The TRP control circuitry 304 uses the second signal and the first feedback signal 106 to estimate the TRP and provide the TRP estimate. In one embodiment of the TRP control circuitry 304, the TRP control circuitry 304 substantially ignores amplitude variations in the first signal and the second signal having a bandwidth greater than a bandwidth of the TRP-drift. In this regard, the gain adjustment to the RF amplification circuit 36(1) is based on the TRP estimate in general and further based on the amplified feedback signal 314 in particular. The gain error detection circuit 98 receives the amplitude reference signal 310 and the envelope amplitude feedback signal 312, and provides the gain error signal 114 based on the amplitude difference between the amplitude reference signal 310 and the envelope amplitude feedback signal 312. In this regard, the gain adjustment to the RF amplification circuit 36(1) is based on the amplitude difference between the amplitude reference signal 310 and the envelope amplitude feedback signal 312 in general, and is based on the gain error signal 114 in particular. The amplitude reference signal 310 is based on the target reference amplitude and the envelope amplitude feedback signal 312 is based on the measured feedback amplitude. In this regard, RF gain control is used as TRP control and a current from the first final stage replica amplifier 92 is used for gain linearization.

Figure 17:
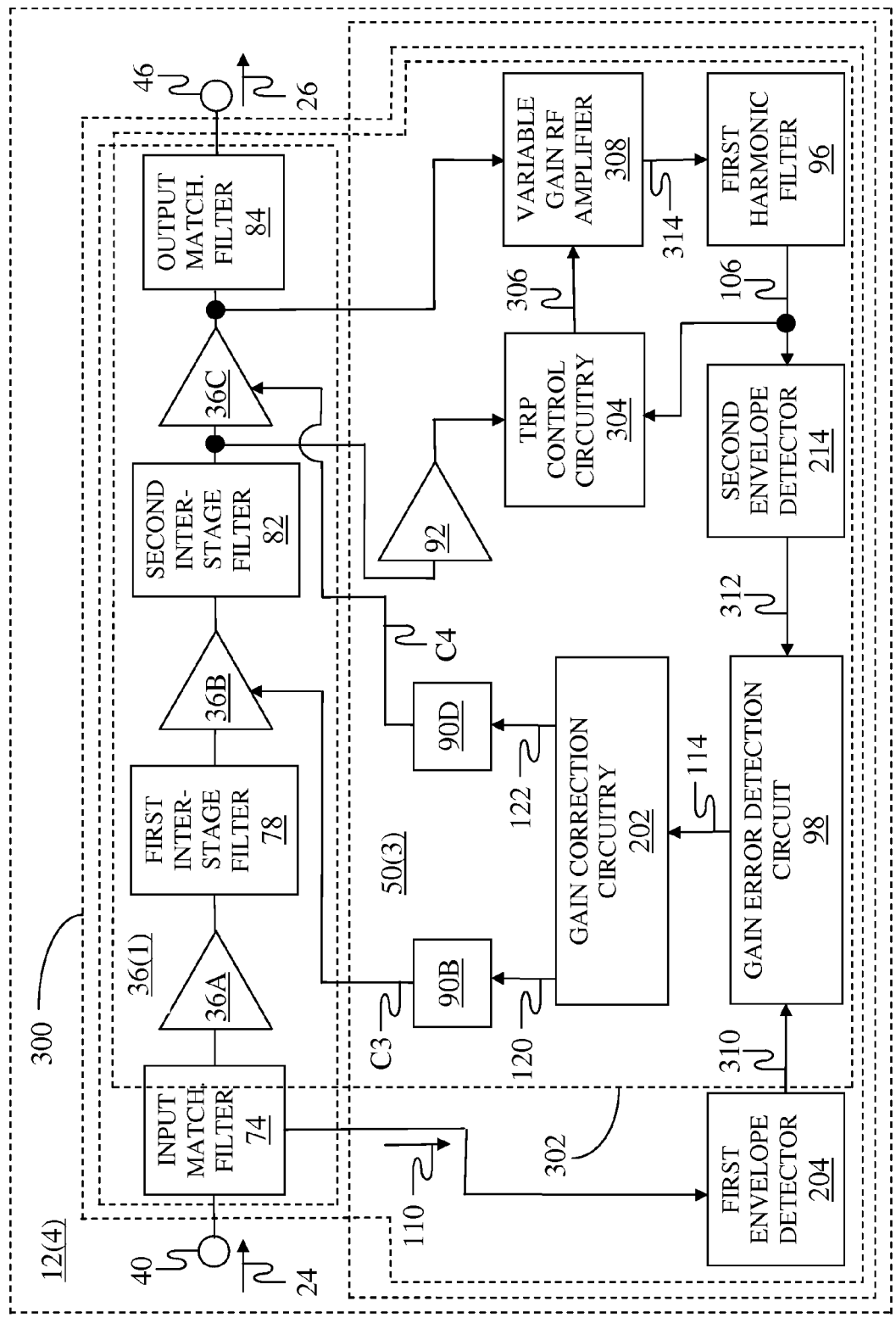
FIG. 17 shows the RF amplification device based on the RF amplification device illustrated in FIG. 1 according to one embodiment of the RF amplification device.

FIG. 17 shows the RF amplification device 12(4) based on the RF amplification device 12 illustrated in FIG. 1 according to an additional embodiment of the RF amplification device 12(4). The RF amplification device 12(4) illustrated in FIG. 17 is similar to the RF amplification device 12(4) illustrated in FIG. 16, except in the RF amplification device 12(4) illustrated in FIG. 17, the variable gain RF amplifier 308 is coupled to the output from the final RF amplifier stage 36C instead of being coupled to output from the first final stage replica amplifier 92. Further, the TRP control circuitry 304 is coupled to the output from the first final stage replica amplifier 92 instead of being coupled to the output from the final RF amplifier stage 36C.

Figure 18:
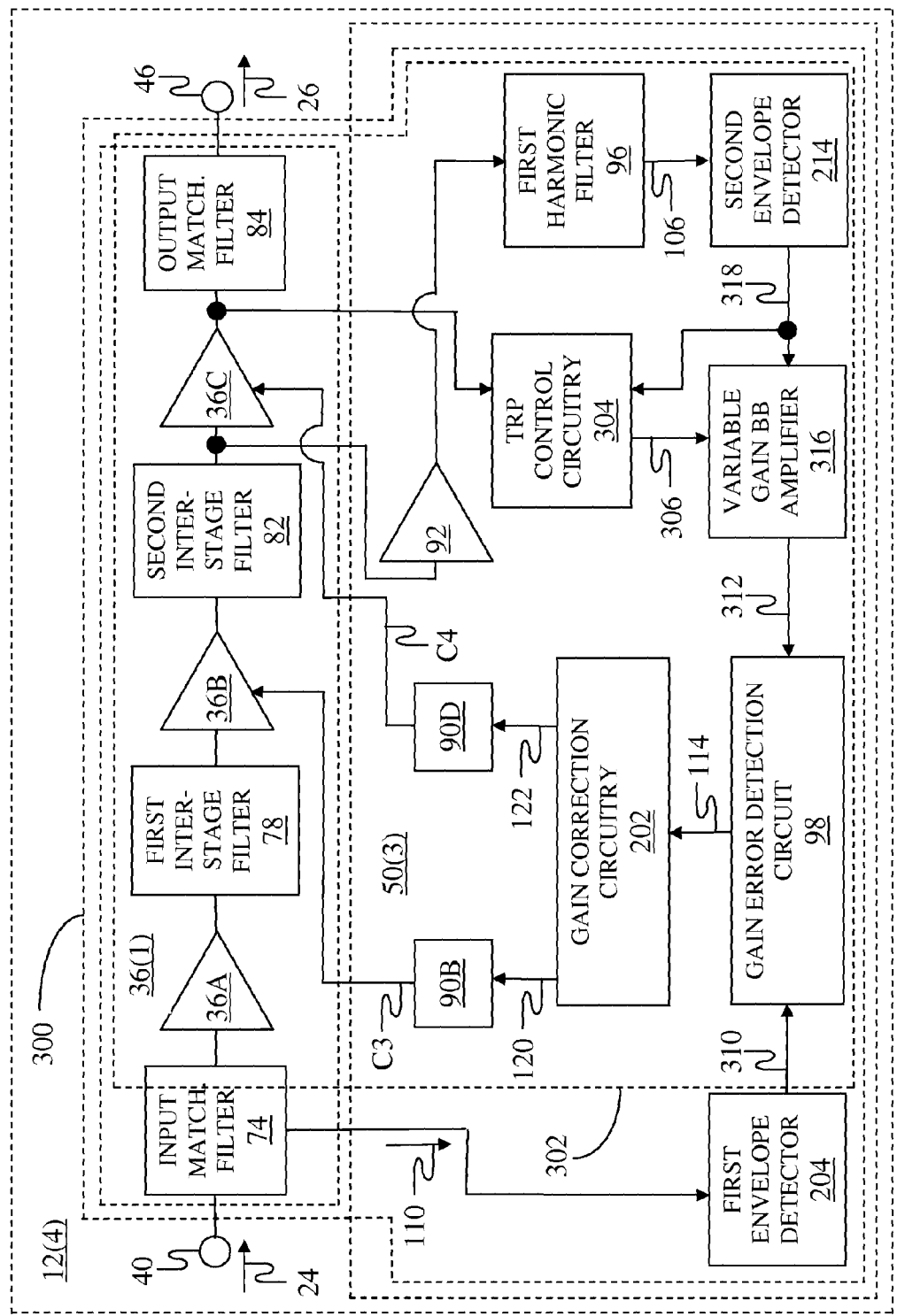
FIG. 18 shows the RF amplification device based on the RF amplification device illustrated in FIG. 1 according to an additional embodiment of the RF amplification device.

FIG. 18 shows the RF amplification device 12(4) based on the RF amplification device 12 illustrated in FIG. 1 according to another embodiment of the RF amplification device 12(4). The RF amplification device 12(4) illustrated in FIG. 18 is similar to the RF amplification device 12(4) illustrated in FIG. 16, except in the RF amplification device 12(4) illustrated in FIG. 18, the variable gain RF amplifier 308 is replaced with a variable gain baseband amplifier 316.

The TRP control circuitry 304 is coupled to an output from the final RF amplifier stage 36C and to an output from the second envelope detector 214. The first harmonic filter 96 is coupled between an output from first final stage replica amplifier 92 and the second envelope detector 214. The variable gain baseband amplifier 316 is coupled between an output from the second envelope detector 214 and the gain error detection circuit 98.

The first final stage replica amplifier 92 provides a first signal, which is representative of an amplified RF signal current of the amplified RF signal 26, to the first harmonic filter 96. The TRP control circuitry 304 provides the fast loop gain control signal 306 to the variable gain baseband amplifier 316 based on the first signal and the second signal, such that a gain of the variable gain baseband amplifier 316 is based on the fast loop gain control signal 306. The first harmonic filter 96 filters out harmonics of the first signal to provide the first feedback signal 106. The second envelope detector 214 receives and detects the first feedback signal 106 to provide a baseband feedback signal 318 to the variable gain baseband amplifier 316 and the TRP control circuitry 304.

The variable gain baseband amplifier 316 amplifies the baseband feedback signal 318 to provide the amplitude feedback signal 312 based on a gain of the variable gain baseband amplifier 316. The final RF amplifier stage 36C provides a second signal, which is representative of an amplified RF signal voltage of the amplified RF signal 26, to the TRP control circuitry 304. Additionally, the TRP control circuitry 304 receives the baseband feedback signal 318. The TRP control circuitry 304 uses the second signal and the baseband feedback signal 318 to estimate the TRP and provide the TRP estimate. In one embodiment of the TRP control circuitry 304, the TRP control circuitry 304 substantially ignores amplitude variations in the first signal and the second signal having a bandwidth greater than a bandwidth of the TRP-drift.

In this regard, the gain adjustment to the RF amplification circuit 36(1) is based on the TRP estimate in general and further based on the baseband feedback signal 318 in particular. The gain error detection circuit 98 receives the amplitude reference signal 310 and the envelope amplitude feedback signal 312, and provides the gain error signal 114 based on the amplitude difference between the amplitude reference signal 310 and the envelope amplitude feedback signal 312. In this regard, the gain adjustment to the RF amplification circuit 36(1) is based on the amplitude difference between the amplitude reference signal 310 and the envelope amplitude feedback signal 312 in general, and is based on the gain error signal 114 in particular. In this regard, baseband gain variations are used as TRP control and a current from the first final stage replica amplifier 92 is used for gain linearization.

Figure 19:
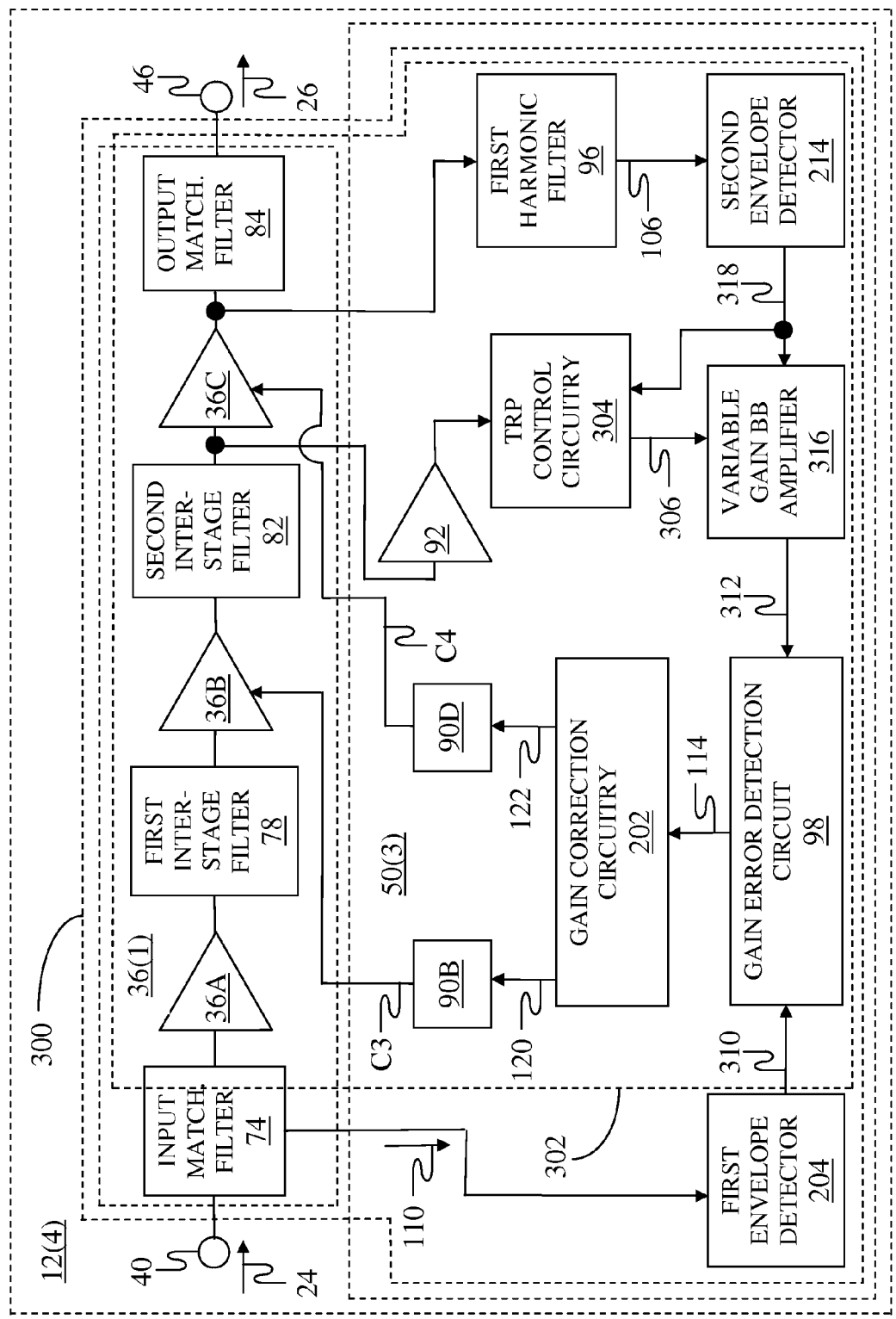
FIG. 19 shows the RF amplification device based on the RF amplification device illustrated in FIG. 1 according to an alternate embodiment of the RF amplification device.

FIG. 19 shows the RF amplification device 12(4) based on the RF amplification device 12 illustrated in FIG. 1 according to a further embodiment of the RF amplification device 12(4). The RF amplification device 12(4) illustrated in FIG. 19 is similar to the RF amplification device 12(4) illustrated in FIG. 18, except in the RF amplification device 12(4) illustrated in FIG. 19, the first harmonic filter 96 is coupled to the output from the final RF amplifier stage 36C instead of being coupled to output from the first final stage replica amplifier 92. Further, the TRP control circuitry 304 is coupled to the output from the first final stage replica amplifier 92 instead of being coupled to the output from the final RF amplifier stage 36C. In this regard, baseband gain variations are used as TRP control and a voltage from the final RF amplifier stage 36C is used for gain linearization.

Figure 20:
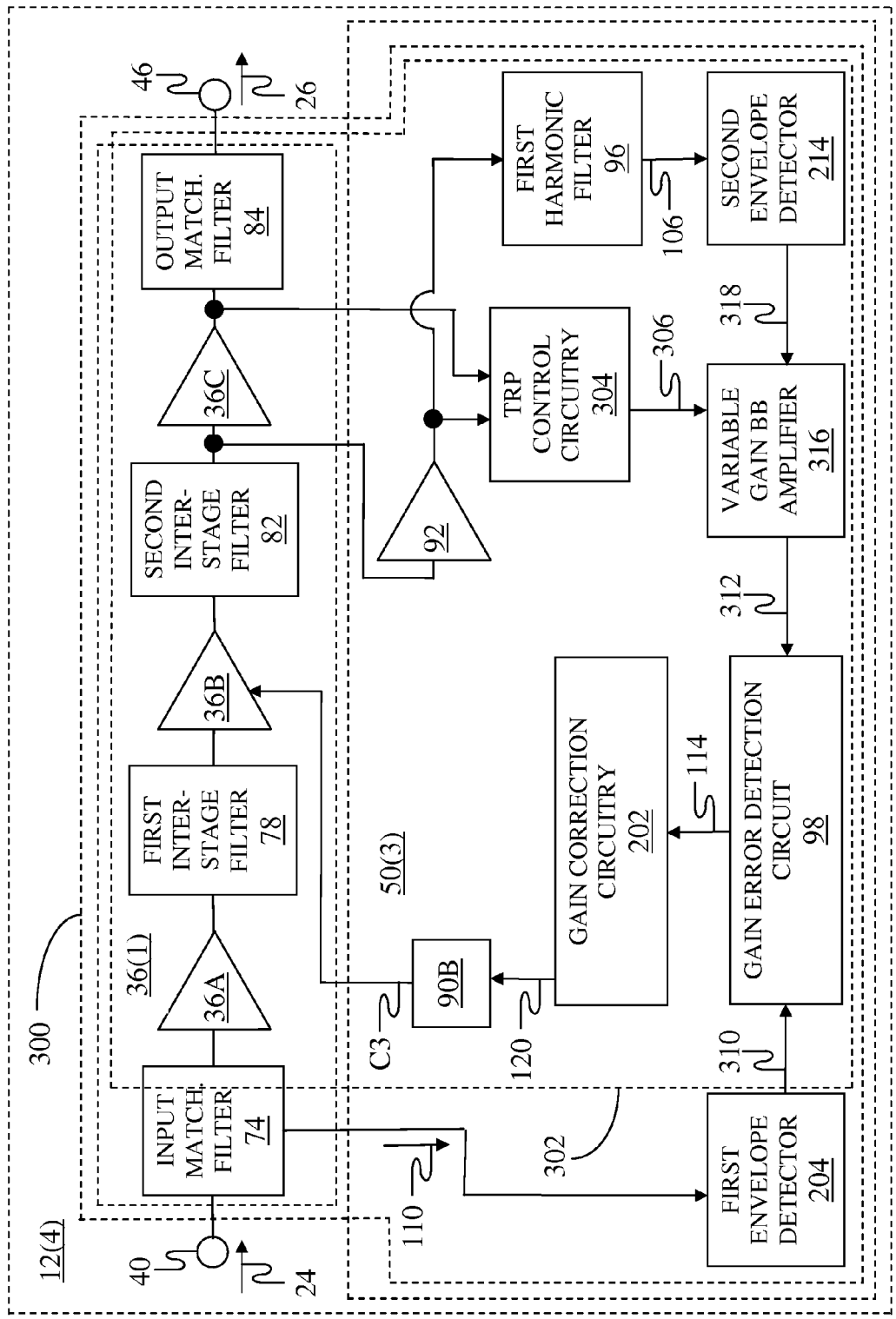
FIG. 20 shows the RF amplification device based on the RF amplification device illustrated in FIG. 1 according to another embodiment of the RF amplification device.

FIG. 20 shows the RF amplification device 12(4) based on the RF amplification device 12 illustrated in FIG. 1 according to an adjunct embodiment of the RF amplification device 12(4). The RF amplification device 12(4) illustrated in FIG. 20 is similar to the RF amplification device 12(4) illustrated in FIG. 18, except in the RF amplification device 12(4) illustrated in FIG. 20, the final stage gain control block 90D is omitted, thereby reducing gain adjustment to a single point. As such, interference between gain linearization and phase linearization may be reduced.

Figure 21:
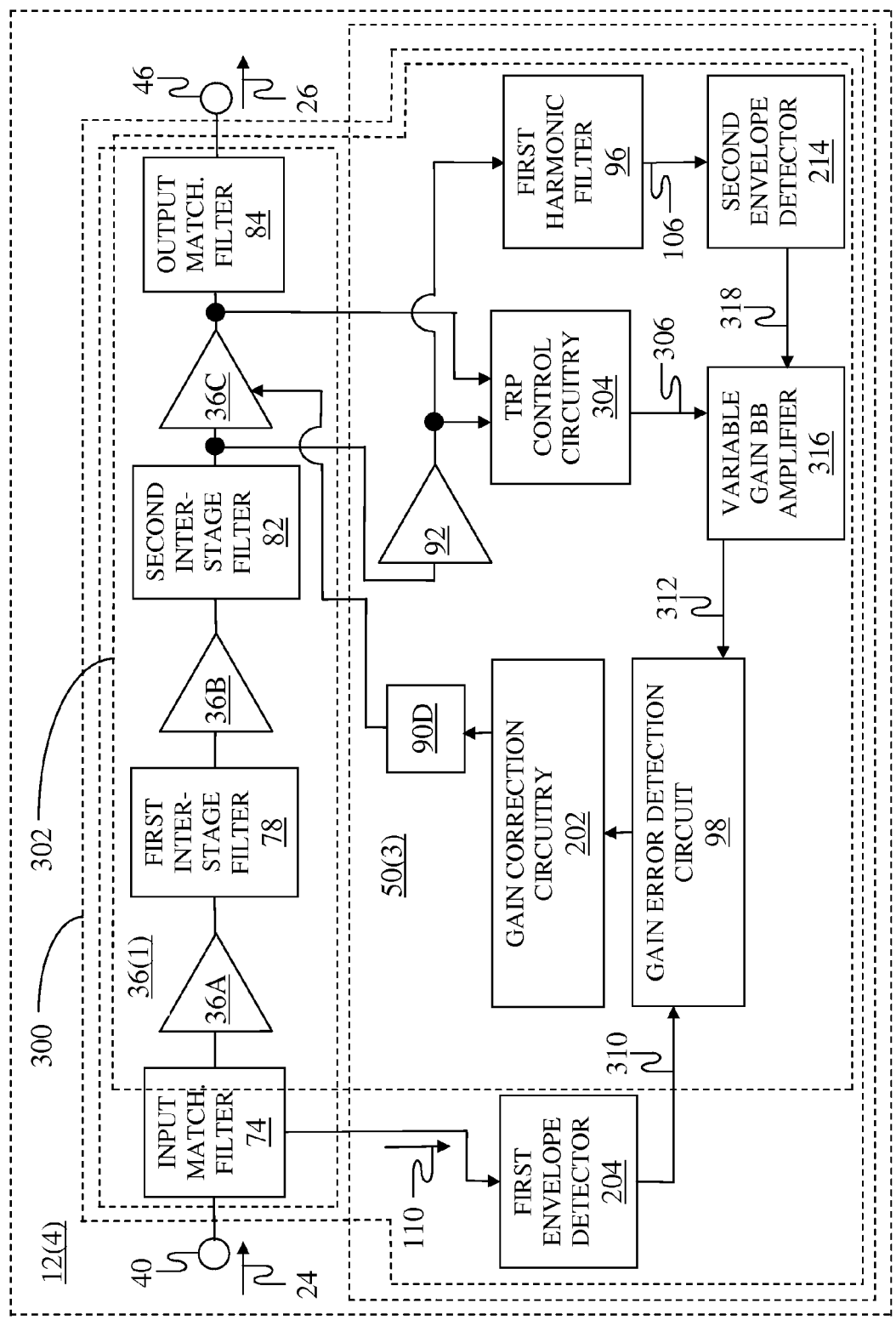
FIG. 21 shows the RF amplification device based on the RF amplification device illustrated in FIG. 1 according to a further embodiment of the RF amplification device.

FIG. 21 shows the RF amplification device 12(4) based on the RF amplification device 12 illustrated in FIG. 1 according to an alternate embodiment of the RF amplification device 12(4). The RF amplification device 12(4) illustrated in FIG. 21 is similar to the RF amplification device 12(4) illustrated in FIG. 18, except in the RF amplification device 12(4) illustrated in FIG. 21, the driver stage gain control block 90B is omitted, thereby reducing gain adjustment to a single point. As such, interference between gain linearization and phase linearization may be reduced.

Figure 22:
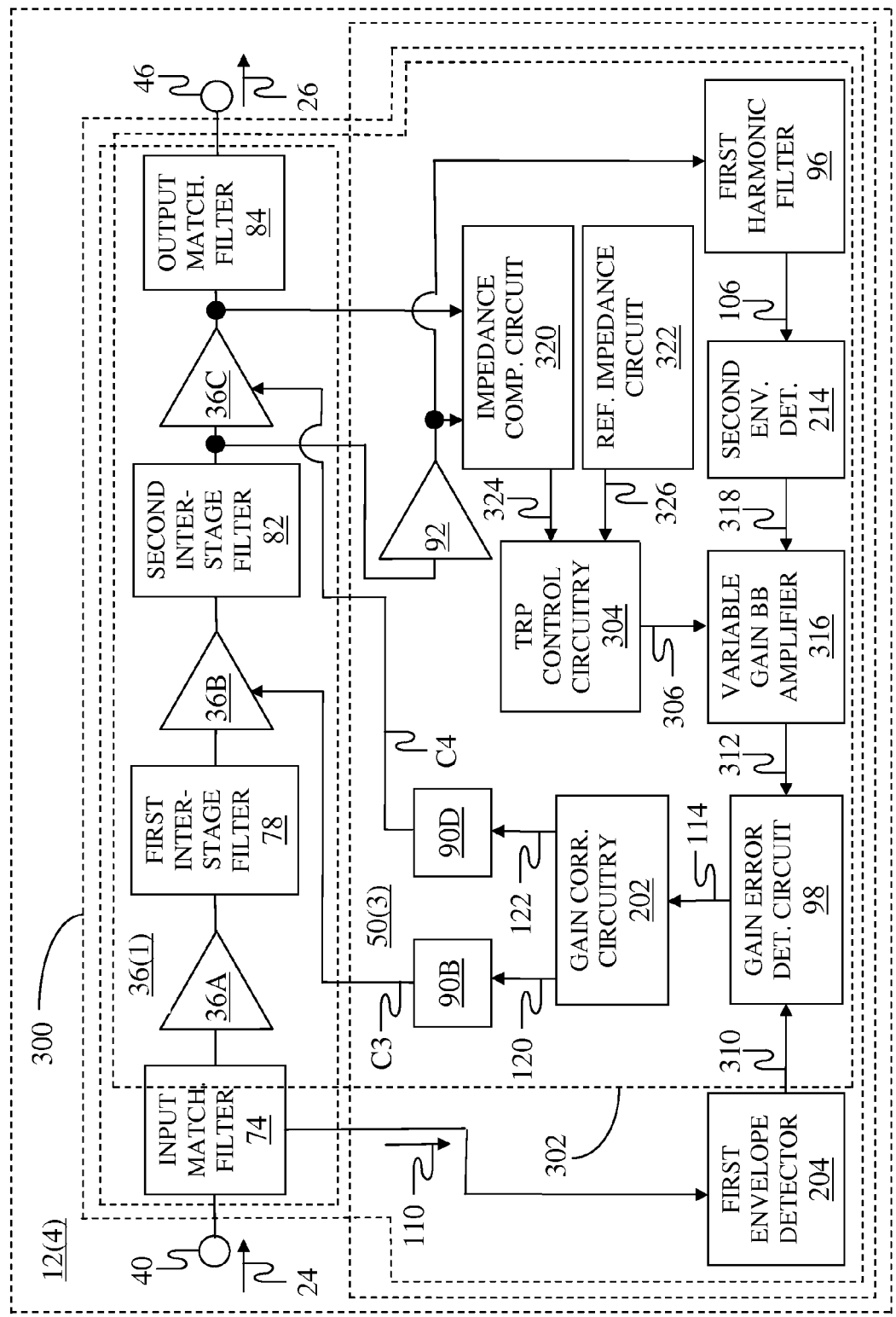
FIG. 22 shows the RF amplification device based on the RF amplification device illustrated in FIG. 1 according to an adjunct embodiment of the RF amplification device.

FIG. 22 shows the RF amplification device 12(4) based on the RF amplification device 12 illustrated in FIG. 1 according to an additional embodiment of the RF amplification device 12(4). The RF amplification device 12(4) illustrated in FIG. 22 is similar to the RF amplification device 12(4) illustrated in FIG. 21, except in the RF amplification device 12(4) illustrated in FIG. 22, the closed-loop gain linearization circuit 50(3) further includes the driver stage gain control block 90B, an impedance computation circuit 320, and a reference impedance circuit 322.

The impedance computation circuit 320 receives the first signal and the second signal. As such, the impedance computation circuit 320 has representation of the amplified RF signal voltage and the amplified RF signal current. The impedance computation circuit 320 provides an impedance computation signal 324 to the TRP control circuitry 304 and the reference impedance circuit 322 provides a reference impedance signal 326 to the TRP control circuitry 304. The reference impedance circuit 322 has a reference impedance, such that the reference impedance signal 326 is based on the reference impedance. The TRP control circuitry 304 estimates the TRP using the impedance computation signal 324 and the reference impedance signal 326. As such, the TRP estimate is based on a difference between an estimated load impedance and the reference impedance.

Figure 23:
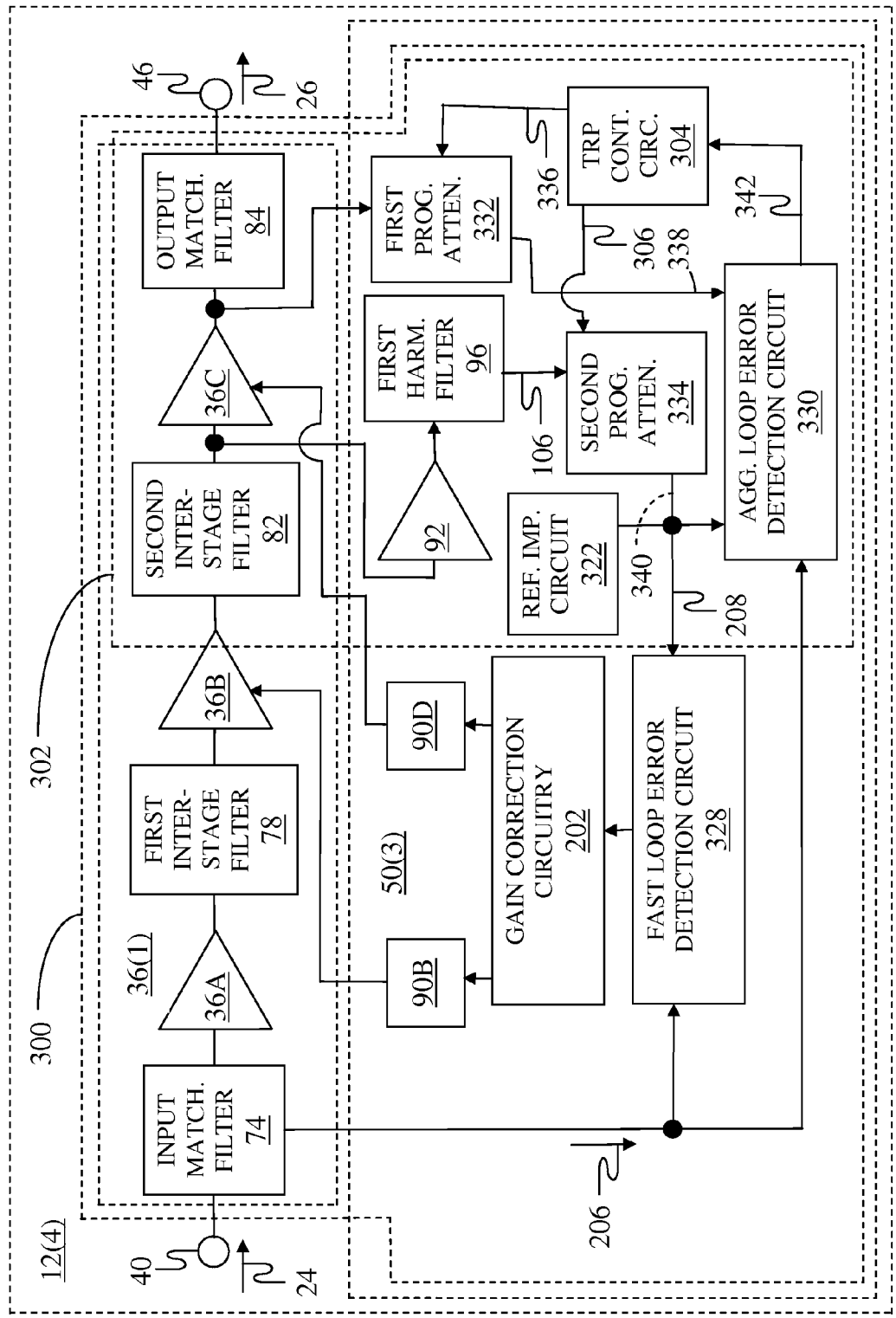
FIG. 23 shows the RF amplification device based on the RF amplification device illustrated in FIG. 1 according to adjunct embodiment of the RF amplification device.

FIG. 23 shows the RF amplification device 12(4) based on the RF amplification device 12 illustrated in FIG. 1 according to another embodiment of the RF amplification device 12(4). The RF amplification device 12(4) illustrated in FIG. 23 is similar to the RF amplification device 12(4) illustrated in FIG. 18, except in the RF amplification device 12(4) illustrated in FIG. 23, the slow control loop 302 includes a first programmable attenuator 332, which provides a first attenuated feedback signal 338, and the TRP control circuitry 304. As such, the slow control loop 302 controls a slow loop gain of the slow control loop 302 by adjusting the first programmable attenuator 332 via a slow loop gain control signal 336 using the TRP control circuitry 304 based on an aggregated baseband error signal 342.

The fast control loop includes a second programmable attenuator 334, which provides a second attenuated feedback signal 340, and the TRP control circuitry 304 to control the fast loop gain of the fast control loop 300 by adjusting the second programmable attenuator 334 via the fast loop gain control signal 306 using the TRP control circuitry 304 based on the aggregated baseband error signal 342.

Each of the first programmable attenuator 332, the second programmable attenuator 334, or both may apply a gain adjustment to the RF amplification circuit 36(1) based on the slow loop gain and the fast loop gain, respectively, wherein the first programmable attenuator 332 controls TRP-drift in the RF amplification circuit 36(1) and the second programmable attenuator 334 controls amplitude distortion in the RF amplification circuit 36(1).

The fast loop error detection circuit 328 sends the gain adjustment to the gain correction circuitry 202 based on a power difference between the power reference signal 206 and the power feedback signal 208. The aggregated loop error detection circuit 330 provides the aggregated baseband error signal 342 based on a difference between the second attenuated feedback signal 340, which provides the power feedback signal 208 by using the reference impedance circuit 322, and the first attenuated feedback signal 338. The fast loop gain control signal 306 is used as a down-conversion reference signal for the aggregated loop error detection circuit 330. As such, the TRP estimate is based on a reference power computation.

Figure 24:
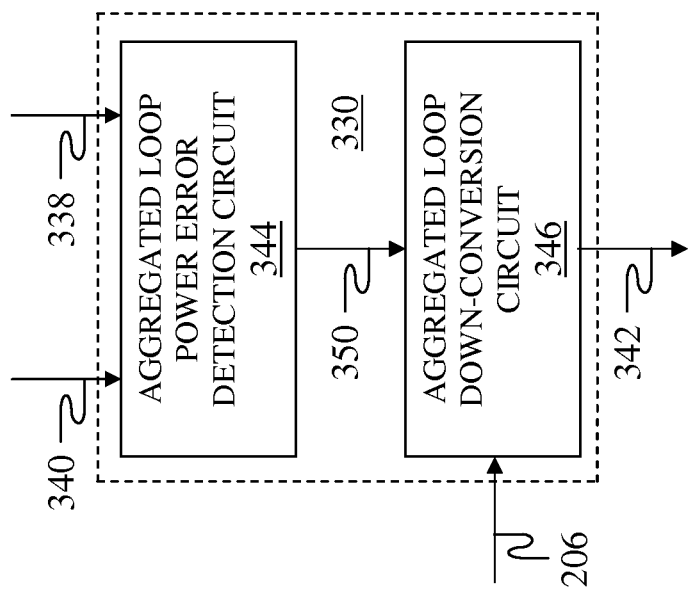
FIG. 24 shows details of an aggregated loop error detection circuit illustrated in FIG. 23 according to one embodiment of the aggregated loop error detection circuit.

FIG. 24 shows details of the aggregated loop error detection circuit 330 illustrated in FIG. 23 according to one embodiment of the aggregated loop error detection circuit 330. The aggregated loop error detection circuit 330 includes a aggregated loop power error detection circuit 344 and a aggregated loop down-conversion circuit 346. The slow control loop 300 and the fast control loop 302 include the aggregated loop error detection circuit 330, which includes an aggregated loop power error detection circuit 344 and an aggregated loop down-conversion circuit 346. The aggregated loop power error detection circuit 344 is configured to provide an aggregated loop power error 350 signal based on a difference between the first attenuated feedback signal 338 and the second attenuated feedback signal 340. The aggregated loop down-conversion circuit 346 is configured to receive and down-convert the aggregated loop power error signal 350 to provide the aggregated loop error signal 342 using the power reference signal 206 as a local oscillator signal.

Those skilled in the art will recognize improvements and modifications to the embodiments of the present disclosure. All such improvements and modifications are considered within the scope of the concepts disclosed herein and the claims that follow.

What is claimed is:

1. Circuitry comprising an IC package, which comprises:
   a package interface coupled to upstream RF system circuitry;
   an RF amplification circuit configured to amplify an RF signal to generate an amplified RF signal; and
   a closed-loop gain linearization circuit, such that the RF amplification circuit and the closed-loop gain linearization circuit form a fast control loop and a slow control loop, wherein:
      the slow control loop is configured to:
         estimate a total radiated power (TRP) from the RF amplification circuit to create a TRP estimate using a representation of the amplified RF signal; and
         control a fast loop gain of the fast control loop based on the TRP estimate; and
      the fast control loop is configured to apply a gain adjustment to the RF amplification circuit based on the fast loop gain and a difference between a target reference amplitude and a measured feedback amplitude, wherein the gain adjustment controls amplitude distortion in the RF amplification circuit and the fast loop gain controls TRP-drift in the RF amplification circuit, wherein the TRP-drift is at least partially based on Voltage Standing Wave Ratio (VSWR) variations presented to an output from the RF amplification circuit.

2. The circuitry of claim 1 wherein the package interface is configured to receive the RF signal and provide the amplified RF signal, wherein the slow control loop is further configured to endogenously estimate the TRP from the RF amplification circuit.

3. The circuitry of claim 1 wherein the amplitude distortion is at least partially based on amplitude variations of the RF signal.

4. The circuitry of claim 1 wherein a bandwidth of the slow control loop is less than about 100 hertz and a bandwidth of the fast control loop is greater than about 100 hertz and less than about one gigahertz.

5. The circuitry of claim 1 wherein the closed-loop gain linearization circuit comprises a gain error detection circuit configured to:
receive an amplitude reference signal and compute the target reference amplitude;
receive an amplitude feedback signal and compute the measured feedback amplitude; and
provide a gain error signal based on an amplitude difference between the amplitude reference signal and the amplitude feedback signal, such that the gain adjustment to the RF amplification circuit is further based on the gain error signal.

6. The circuitry of claim 5 wherein the closed-loop gain linearization circuit further comprises a variable gain RF amplifier configured to:
receive a first signal, which is representative of an amplified RF signal current of the amplified RF signal; and
provide an amplified feedback signal based on amplifying the first signal, wherein:
the amplitude feedback signal is based on the amplified feedback signal; and
a gain of the variable gain RF amplifier is based on the fast loop gain control signal.

7. The circuitry of claim 6 wherein the closed-loop gain linearization circuit further comprises a first harmonic filter configured to receive and filter the amplified feedback signal to provide a feedback signal, such that the amplitude feedback signal is further based on the feedback signal.

8. The circuitry of claim 5 wherein the closed-loop gain linearization circuit further comprises TRP control circuitry configured to:
estimate the TRP using a first signal and a second signal to provide the TRP estimate, wherein the amplified RF signal has an amplified RF signal voltage and an amplified RF signal current, such that the first signal is representative of the amplified RF signal current and the second signal is representative of the amplified RF signal voltage; and
provide a fast loop gain control signal based on the TRP estimate, such that control of the fast loop gain is via the fast loop gain control signal.

9. The circuitry of claim 8 wherein the TRP control circuitry is further configured to substantially ignore amplitude variations in the first signal and the second signal having a bandwidth greater than a bandwidth of the TRP-drift.

10. The circuitry of claim 8 wherein the closed-loop gain linearization circuit further comprises a variable gain RF amplifier configured to:
receive and amplify the second signal to provide an amplified feedback signal, such that the gain adjustment to the RF amplification circuit is further based on the amplified feedback signal; and
adjust a gain of the variable gain RF amplifier based on the fast loop gain control signal.

11. The circuitry of claim 8 wherein the closed-loop gain linearization circuit further comprises a variable gain baseband amplifier configured to:
receive and amplify a baseband signal, which is based on the first signal, to provide an amplitude feedback signal, such that the gain adjustment to the RF amplification circuit is further based on the amplitude feedback signal; and
adjust a gain of the variable gain baseband amplifier based on the fast loop gain control signal.

12. The circuitry of claim 8 wherein the closed-loop gain linearization circuit further comprises a variable gain baseband amplifier configured to:
receive and amplify a baseband signal, which is based on the second signal, to provide an amplitude feedback signal, such that the gain adjustment to the RF amplification circuit is further based on the amplitude feedback signal; and
adjust a gain of the variable gain baseband amplifier based on the fast loop gain control signal.

13. The circuitry of claim 1 wherein the closed-loop gain linearization circuit further comprises:
TRP control circuitry configured to estimate the TRP using an impedance computation signal and a reference impedance signal;
a reference impedance circuit having a reference impedance, such that the reference impedance signal is based on the reference impedance; and
an impedance computation circuit configured to provide the impedance computation signal based on a first signal and a second signal, wherein the amplified RF signal has an amplified RF signal voltage and an amplified RF signal current, such that the first signal is representative of the amplified RF signal voltage and the second signal is representative of the amplified RF signal current.

14. Circuitry comprising:
an RF amplification circuit configured to amplify an RF signal to generate an amplified RF signal; and
a closed-loop gain linearization circuit, such that the RF amplification circuit and the closed-loop gain linearization circuit form a fast control loop and a slow control loop, wherein:
the slow control loop includes a first programmable attenuator and a total radiated power (TRP) control circuit and is configured to control a slow loop gain of the slow control loop by adjusting the first programmable attenuator using the TRP control circuit based on aggregated loop error signal;
the fast control loop includes a second programmable attenuator and the TRP control circuit and is configured to control a fast loop gain of the fast control loop by adjusting the second programmable attenuator using the TRP control circuit based on the aggregated loop error signal; and
each of the first programmable attenuator and the second programmable attenuator is configured to apply a gain adjustment to the RF amplification circuit based on the slow loop gain and the fast loop gain, respectively, wherein the first programmable attenuator controls TRP-drift in the RF amplification circuit and the second programmable attenuator controls amplitude distortion in the RF amplification circuit.

15. The circuitry of claim 14 wherein:
the slow control loop and the fast control loop further include an aggregated loop power error detection circuit and an aggregated loop down-conversion circuit;
the first programmable attenuator is configured to provide a first attenuated feedback signal and the second programmable attenuator provides is configured to provide a second attenuated feedback signal;
the aggregated loop error detection circuit is configured to provide an aggregated loop power error signal based on a difference between the first attenuated feedback signal and the second attenuated feedback signal; and the aggregated loop down-conversion circuit is configured to receive and down-convert the aggregated loop power error signal to provide the aggregated loop error signal.

16. Circuitry comprising:
an integrated circuit (IC) package having a package interface coupled to upstream RF system circuitry and configured to receive a radio frequency (RF) signal from the upstream RF system circuitry and provide an amplified RF signal;
an RF amplification circuit in the IC package and configured to amplify the RF signal to generate the amplified RF signal; and
a closed-loop gain linearization circuit in the IC package and configured to endogenously:
estimate a total radiated power (TRP) from the RF amplification circuit to create a TRP estimate of the amplified RF signal;
determine a measured feedback power based on the TRP estimate; and
apply a gain adjustment to the RF amplification circuit based on a power difference between a target reference power of the amplified RF signal and the measured feedback power, wherein the gain adjustment controls at least one of amplitude distortion in the RF amplification circuit and TRP-drift in the RF amplification circuit, wherein the TRP-drift is at least partially based on Voltage Standing Wave Ratio (VSWR) variations presented to an output from the RF amplification circuit.

17. The circuitry of claim 16 wherein the amplitude distortion is at least partially based on amplitude variations of the RF signal.

18. The circuitry of claim 16 wherein a bandwidth of the TRP-drift is less than about 100 hertz and a bandwidth of the amplitude distortion is greater than about 100 hertz and less than about 2 gigahertz.

19. The circuitry of claim 16 wherein the closed-loop gain linearization circuit is further configured to establish the target reference power based on the RF signal.

20. The circuitry of claim 16 wherein the closed-loop gain linearization circuit comprises a gain error detection circuit configured to:
receive a power reference signal, which is based on the target reference power;
receive a power feedback signal, which is based on the measured feedback power; and
provide a gain error signal based on a power difference between the power reference signal and the power feedback signal, such that the gain adjustment to the RF amplification circuit is further based on the gain error signal.

21. The circuitry of claim 20 wherein the closed-loop gain linearization circuit further comprises:
a first harmonic filter configured to receive and filter a signal that is representative of an amplified RF signal current to provide a first feedback signal;
a second harmonic filter configured to receive and filter a signal that is representative of an amplified RF signal voltage to provide a second feedback signal; and
a delivered power estimation circuit configured to estimate the TRP using the first feedback signal and the second feedback signal, and provide the power feedback signal based on the TRP estimate, wherein the amplified RF signal has the amplified RF signal voltage and the amplified RF signal current.

22. The circuitry of claim 20 wherein the closed-loop gain linearization circuit further comprises:
a first harmonic filter configured to receive and filter a first signal that is representative of an amplified RF signal current to provide a feedback signal; and
a delivered power estimation circuit configured to:
receive a second signal that is representative of an amplified RF signal voltage;
substantially ignore amplitude variations in the second signal having a bandwidth greater than a bandwidth of the TRP-drift; and
estimate the TRP using the feedback signal and the second signal to provide the TRP estimate and provide the power feedback signal based on the TRP estimate, wherein the amplified RF signal has the amplified RF signal voltage and the amplified RF signal current.

23. The circuitry of claim 20 wherein the closed-loop gain linearization circuit further comprises:
a first harmonic filter configured to receive and filter a second signal that is representative of an amplified RF signal voltage to provide a feedback signal; and
a delivered power estimation circuit configured to:
receive a first signal that is representative of an amplified RF signal current;
substantially ignore amplitude variations in the first signal having a bandwidth greater than a bandwidth of the TRP-drift; and
estimate the TRP using the feedback signal and the first signal to provide the TRP estimate and provide the power feedback signal based on the TRP estimate, wherein the amplified RF signal has the amplified RF signal voltage and the amplified RF signal current.

24. The circuitry of claim 20 wherein the closed-loop gain linearization circuit further comprises:
a delivered power estimation circuit configured to estimate the TRP using a first signal and a second signal to provide the TRP estimate, wherein the amplified RF signal has an amplified RF signal voltage and an amplified RF signal current, such that the second signal is representative of the amplified RF signal voltage and the first signal is representative of the amplified RF signal current;
substantially ignore amplitude variations in the first signal having a bandwidth greater than a bandwidth of the TRP-drift; and
gain correction circuitry configured to receive the gain error signal and apply the gain adjustment to the RF amplification circuit based on the gain error signal.

25. The circuitry of claim 20 wherein the closed-loop gain linearization circuit further comprises a delivered power estimation circuit configured to provide and adjust a first open-loop control signal to the gain error detection circuit to properly align a closed loop response of the RF amplification circuit with an open loop response of the RF amplification circuit.

26. The circuitry of claim 20 wherein the closed-loop gain linearization circuit further comprises a delivered power estimation circuit, which is configured to provide and adjust a first open-loop control signal to the gain error detection circuit, and further configured to provide and adjust a second open-loop to a gain calibration circuit.

27. The circuitry of claim 20 wherein the closed-loop gain linearization circuit further comprises:
a first harmonic filter configured to receive and filter a signal that is representative of an amplified RF signal current to provide a first feedback signal;

a second harmonic filter configured to receive and filter a signal that is representative of an amplified RF signal voltage to provide a second feedback signal; and a delivered power estimation circuit comprising:
- a first envelope detector configured to receive and detect the first feedback signal to provide a detected current signal;
- a second envelope detector configured to receive and detect the second feedback signal to provide a detected voltage signal; and
- a power computation circuit configured to estimate the TRP using the detected current signal and the detected voltage signal, and provide the power feedback signal based on the TRP estimate, wherein the amplified RF signal has the amplified RF signal voltage and the amplified RF signal current.

28. The circuitry of claim 20 wherein the RF amplification circuit comprises an output match filter configured to provide the amplified RF signal and the closed-loop gain linearization circuit further comprises:
- a first harmonic filter configured to receive and filter a signal that is representative of an amplified RF signal current to provide a first feedback signal; and
- a delivered power estimation circuit comprising:
  - a first envelope detector configured to receive and detect the first feedback signal to provide a detected current signal;
  - a second envelope detector configured to receive and detect the amplified RF signal to provide a detected voltage signal; and
  - a power computation circuit configured to estimate the TRP using the detected current signal and the detected voltage signal, and provide the power feedback signal based on the TRP estimate, wherein the amplified RF signal has the amplified RF signal current.

29. The circuitry of claim 20 wherein the closed-loop gain linearization circuit further comprises:
- a first harmonic filter configured to receive and filter a first signal that is representative of an amplified RF signal current to provide a feedback signal; and
- a delivered power estimation circuit comprising:
  - an envelope detector configured to receive and detect the feedback signal to provide a detected current signal;
  - a VSWR detector configured to receive the feedback signal and a second signal, which is representative of an amplified RF signal voltage, determine a VSWR of the RF amplification circuit based on the feedback signal and the second signal, and provide a voltage based VSWR signal based on the VSWR; and
  - a power computation circuit configured to estimate the TRP using the detected current signal and the voltage based VSWR signal, and provide the power feedback signal based on the TRP estimate.

30. The circuitry of claim 20 wherein the closed-loop gain linearization circuit further comprises:
- a first harmonic filter configured to receive and filter a first signal that is representative of an amplified RF signal voltage to provide a feedback signal; and
- a delivered power estimation circuit comprising:
  - an envelope detector configured to receive and detect the feedback signal to provide a detected voltage signal;
  - a VSWR detector configured to receive the feedback signal and a second signal, which is representative of an amplified RF signal current, determine a VSWR of the RF amplification circuit based on the feedback signal and the second signal, and provide a current based VSWR signal based on the VSWR; and
  - a power computation circuit configured to estimate the TRP using the detected voltage signal and the current based VSWR signal, and provide the power feedback signal based on the TRP estimate.

* * * * *

UNITED STATES PATENT AND TRADEMARK OFFICE
CERTIFICATE OF CORRECTION

Page 1 of 1

PATENT NO. : 9,444,411 B2
APPLICATION NO. : 14/218953
DATED : September 13, 2016
INVENTOR(S) : Baker Scott et al.

It is certified that error appears in the above-identified patent and that said Letters Patent is hereby corrected as shown below:

In the Specification:

In column 19, line 4, replace "control block 901" with --control block 90I--.

In column 22, lines 22, 27, and 31, replace "control block 901" with --control block 90I--.

In column 22, line 40, replace "901 may also" with --90I may also--.

Signed and Sealed this
Eighth Day of November, 2016

Michelle K. Lee
*Director of the United States Patent and Trademark Office*